(12) United States Patent
Sivaramakrishnan et al.

(10) Patent No.: US 10,961,621 B2
(45) Date of Patent: Mar. 30, 2021

(54) CVD REACTOR CHAMBER WITH RESISTIVE HEATING AND SUBSTRATE HOLDER

(71) Applicant: Svagos Technik, Inc., Santa Clara, CA (US)

(72) Inventors: Visweswaren Sivaramakrishnan, Cupertino, CA (US); Tirunelveli S. Ravi, Saratoga, CA (US); Timothy N. Kleiner, Los Gatos, CA (US); Quoc Truong, San Leandro, CA (US)

(73) Assignee: Svagos Technik, Inc., Santa Clara, CA (US)

( * ) Notice: Subject to any disclaimer, the term of this patent is extended or adjusted under 35 U.S.C. 154(b) by 464 days.

(21) Appl. No.: 15/175,000

(22) Filed: Jun. 6, 2016

(65) Prior Publication Data

US 2017/0037514 A1    Feb. 9, 2017

Related U.S. Application Data

(60) Provisional application No. 62/213,087, filed on Sep. 1, 2015, provisional application No. 62/171,202, filed on Jun. 4, 2015.

(51) Int. Cl.

| | |
|---|---|
| *C23C 16/455* | (2006.01) |
| *C23C 16/46* | (2006.01) |
| *C23C 16/458* | (2006.01) |
| *H01L 31/18* | (2006.01) |
| *H01L 21/02* | (2006.01) |
| *C23C 16/44* | (2006.01) |

(Continued)

(52) U.S. Cl.
CPC .... *C23C 16/45502* (2013.01); *C23C 16/4412* (2013.01); *C23C 16/4587* (2013.01);
(Continued)

(58) Field of Classification Search
CPC ................... C23C 16/4587; C23C 16/45502
See application file for complete search history.

(56) References Cited

U.S. PATENT DOCUMENTS

| 4,186,684 A | * | 2/1980 | Intrater | ............... C23C 16/4587 |
| | | | | 118/724 |
| 5,976,255 A | * | 11/1999 | Takaki | ................... C23C 14/50 |
| | | | | 118/500 |

(Continued)

FOREIGN PATENT DOCUMENTS

| KR | 10-1043211 B1 | 6/2011 |
| KR | 10-2013-0043399 A | 4/2013 |

OTHER PUBLICATIONS

International Search Report and Written Opinion dated Jan. 20, 2017, for PCT/US2016/050016.

*Primary Examiner* — Keath T Chen
(74) *Attorney, Agent, or Firm* — Pillsbury Winthrop Shaw Pittman LLP

(57) ABSTRACT

A CVD reactor for single sided deposition of material on substrates, may comprise: an upper gas manifold and a lower gas manifold; a substrate carrier comprising a gas tight rectangular box open on upper and lower surfaces, a multiplicity of planar walls across the width of the box, the walls being equally spaced in a row facing each other and defining a row of channels within the box, the walls comprising mounting fixtures for a plurality of substrates and at least one electrically resistive heater element; and clamps within the vacuum chamber for making electrical contact to the at least one electrically resistive heater element; wherein the upper gas manifold and the lower gas manifold are configured to attach to the upper and lower surfaces of the substrate carrier, respectively, connect with upper and lower ends of the channels, and isolate gas flows in odd numbered channels from gas flows in even numbered channels, wherein the channels are numbered in order along the row, and wherein the gas flows comprise, for each of the gas manifolds, an exhaust gas flow and a process gas flow.

17 Claims, 29 Drawing Sheets

(51) Int. Cl.
*C30B 25/12* (2006.01)
*C30B 29/06* (2006.01)
*C30B 25/10* (2006.01)

(52) U.S. Cl.
CPC .............. *C23C 16/46* (2013.01); *C30B 25/10* (2013.01); *C30B 25/12* (2013.01); *C30B 29/06* (2013.01); *H01L 21/0262* (2013.01); *H01L 21/02532* (2013.01); *H01L 21/02595* (2013.01); *H01L 21/02598* (2013.01); *H01L 31/184* (2013.01); *H01L 31/1804* (2013.01); *Y02E 10/544* (2013.01); *Y02E 10/547* (2013.01); *Y02P 70/50* (2015.11)

(56) References Cited

U.S. PATENT DOCUMENTS

| | | | |
|---|---|---|---|
| 6,806,211 B2 * | 10/2004 | Shinriki | C23C 16/40 118/715 |
| 8,298,629 B2 | 10/2012 | Sivaramakrishnan | |
| 8,673,081 B2 | 3/2014 | Sivaramakrishnan | |
| 9,255,346 B2 | 2/2016 | Sivaramakrishnan | |
| 2002/0041929 A1 * | 4/2002 | Magne | B05B 13/0228 427/240 |
| 2003/0124820 A1 * | 7/2003 | Johnsgard | C23C 16/455 438/482 |
| 2008/0152803 A1 * | 6/2008 | Lamouroux | C23C 16/045 427/248.1 |
| 2010/0092697 A1 * | 4/2010 | Poppe | C23C 16/45502 427/585 |
| 2010/0215872 A1 | 8/2010 | Sivaramakrishnan | |
| 2010/0263587 A1 | 10/2010 | Sivaramakrishnan | |
| 2011/0283944 A1 * | 11/2011 | Yoshimoto | C23C 16/325 118/728 |
| 2013/0032084 A1 * | 2/2013 | Sivaramakrishnan | C30B 29/06 117/102 |
| 2013/0276707 A1 | 10/2013 | Pierreux | |
| 2014/0134332 A1 | 5/2014 | Sugino | |

* cited by examiner

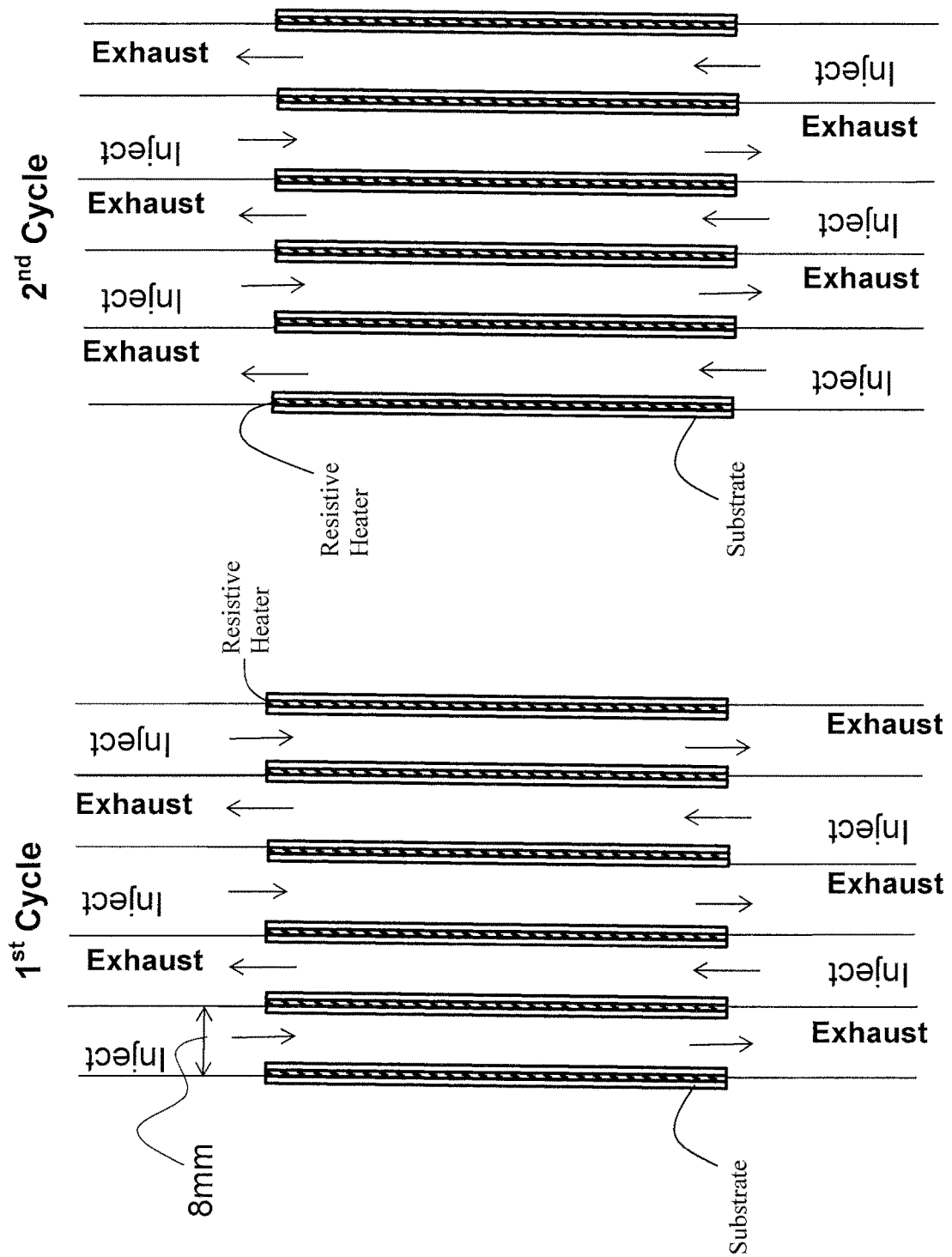

Gas Manifold

SECTION B-B

Gas Manifold Exhaust Gas Tier

SECTION C-C

SECTION A-A

SECTION B-B

SECTION C-C

SECTION A-A

CVD REACTOR CHAMBER WITH RESISTIVE HEATING AND SUBSTRATE HOLDER

CROSS-REFERENCE TO RELATED APPLICATIONS

This application claims the benefit of U.S. Provisional Application No. 62/171,202 filed Jun. 4, 2015 and U.S. Provisional Application No. 62/213,087 filed Sep. 1, 2015, both incorporated by reference in their entirety herein.

FIELD OF THE INVENTION

The present invention relates generally to CVD (chemical vapor deposition) epitaxial reactors, including, although not limited to, CVD reactor chambers with resistive heating and substrate holders for the same.

BACKGROUND

There is a need for tools and methods for efficient and low cost chemical vapor deposition (CVD) of thin and thick films of inorganic material for semiconductor devices, including epitaxial single crystal silicon for solar cell devices.

SUMMARY OF THE INVENTION

According to some embodiments, a CVD reactor for single sided deposition of material on substrates, may comprise: a vacuum chamber; an upper gas manifold and a lower gas manifold within the vacuum chamber; a substrate carrier comprising a gas tight rectangular box open on upper and lower surfaces, the gas tight box comprising a multiplicity of planar walls across the width of the box, the walls being equally spaced in a row facing each other and defining a row of channels within the box, the walls comprising mounting fixtures for a plurality of substrates, the walls comprising at least one electrically resistive heater element; and clamps within the vacuum chamber for making electrical contact to the at least one electrically resistive heater element; wherein the upper gas manifold and the lower gas manifold are configured to attach to the upper and lower surfaces of the substrate carrier, respectively, the upper gas manifold and the lower gas manifold connecting with upper and lower ends of the channels, the upper gas manifold and the lower gas manifold being configured to isolate gas flows in odd numbered channels from gas flows in even numbered channels, wherein the channels are numbered in order along the row, and wherein the gas flows comprise, for each of the upper and lower gas manifolds, an exhaust gas flow and a process gas flow.

According to some embodiments, a CVD reactor for single sided deposition of material on substrates, may comprise: a vacuum chamber; an upper gas manifold and a lower gas manifold within the vacuum chamber; a substrate carrier comprising: (1) a gas tight rectangular box open on upper and lower surfaces, the gas tight box comprising a multiplicity of planar walls across the width of the box, the walls being equally spaced in a row facing each other and defining a row of channels within the box, the walls comprising at least one electrically resistive heater element, and (2) substrate holders configured to fit within the channels, the substrate holders being configured to allow gas flow over both surfaces of substrates when mounted in the substrate holder; and clamps within the vacuum chamber for making electrical contact to the electrically resistive heater elements; wherein the upper gas manifold and the lower gas manifold are configured to attach to the upper and lower surfaces of the substrate carrier, respectively, the upper gas manifold and the lower gas manifold connecting with upper and lower ends of the channels, the upper gas manifold and the lower gas manifold being configured to isolate gas flows in odd numbered channels from gas flows in even numbered channels, wherein the channels are numbered in order along the row, and wherein the gas flows comprise, for each of the upper and lower gas manifolds, an exhaust gas flow and a process gas flow.

According to some embodiments, a method of operating a CVD reactor of the present invention as described above, may comprise: mounting substrates in the substrate carrier; loading the substrate carrier into the vacuum chamber and mating the substrate carrier with the upper gas manifold and the lower gas manifold; providing and maintaining a suitable vacuum environment within the vacuum chamber; making electrical contact to the at least one electrically resistive heater using the clamps; heating the substrates to a deposition temperature by flowing current through the at least one electrically resistive heater; and while heating the substrates, flowing process gas through odd numbered channels from the upper gas manifold to the lower gas manifold, and simultaneously flowing process gas through even numbered channels from the lower gas manifold to the upper gas manifold.

Substrate holders are described herein for holding substrates for single sided deposition according to some embodiments, and in further embodiments substrate holders are described herein for holding substrates for double-sided deposition.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 3A & 3B show cross-sectional views of a representation of a second embodiment of a substrate carrier also showing the separation of gas flows between even and odd channels within the substrate carrier, according to some embodiments of the present invention;

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
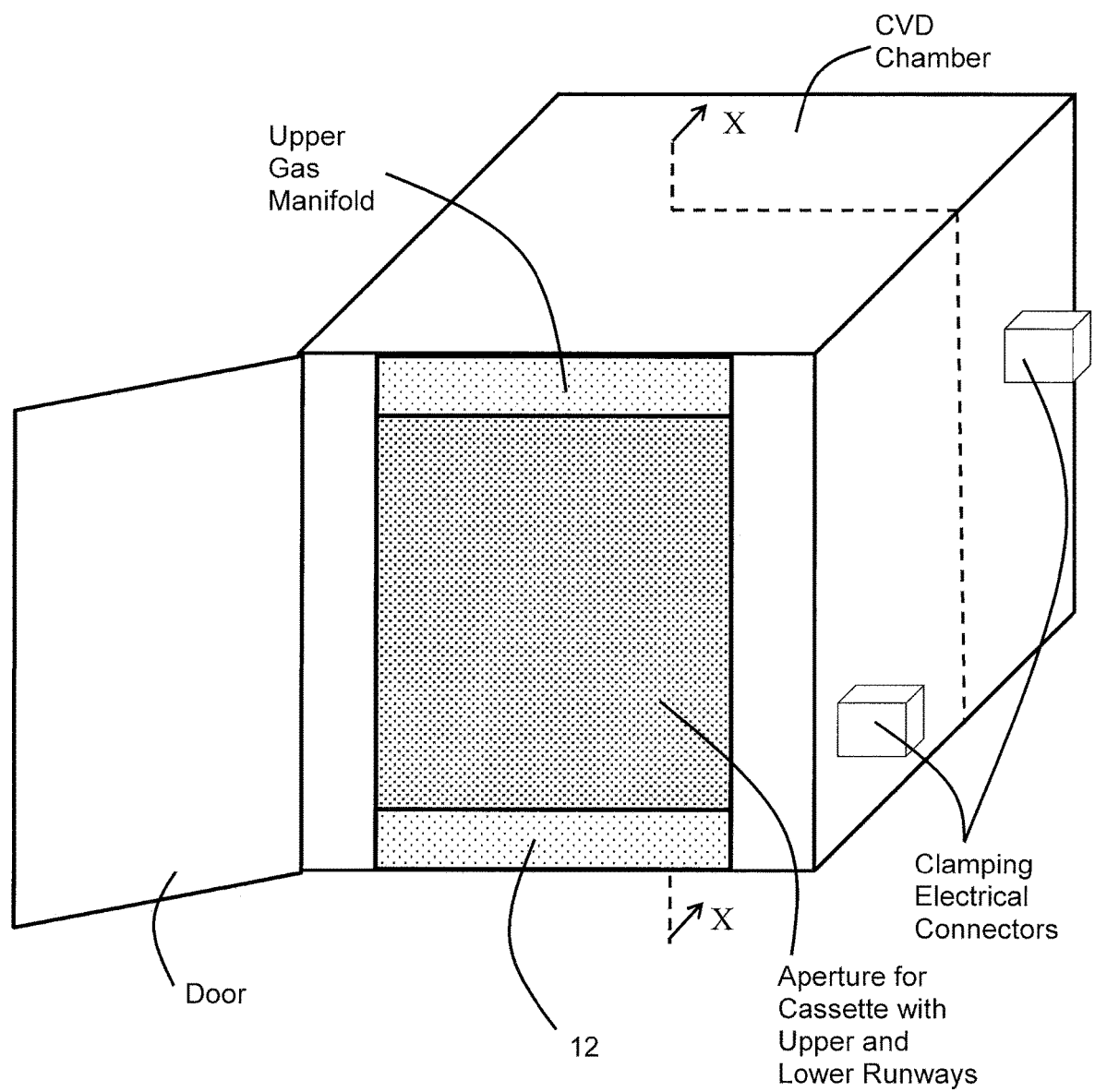
FIG. 1 is a perspective view of a representation of a CVD epitaxial reactor, according to embodiments of the present invention.

FIG. 1 shows a perspective view of a CVD reactor chamber according to some embodiments of the present invention. Upper and lower gas manifolds are shown, with a space between the manifolds for insertion of a substrate carrier. Clamping electrical connectors, used for making electrical contact to electrically resistive heater elements, are also shown; the number and location of these connectors will depend on the configuration and number of electrically resistive heater elements used in the substrate carrier.

Figure 2A:
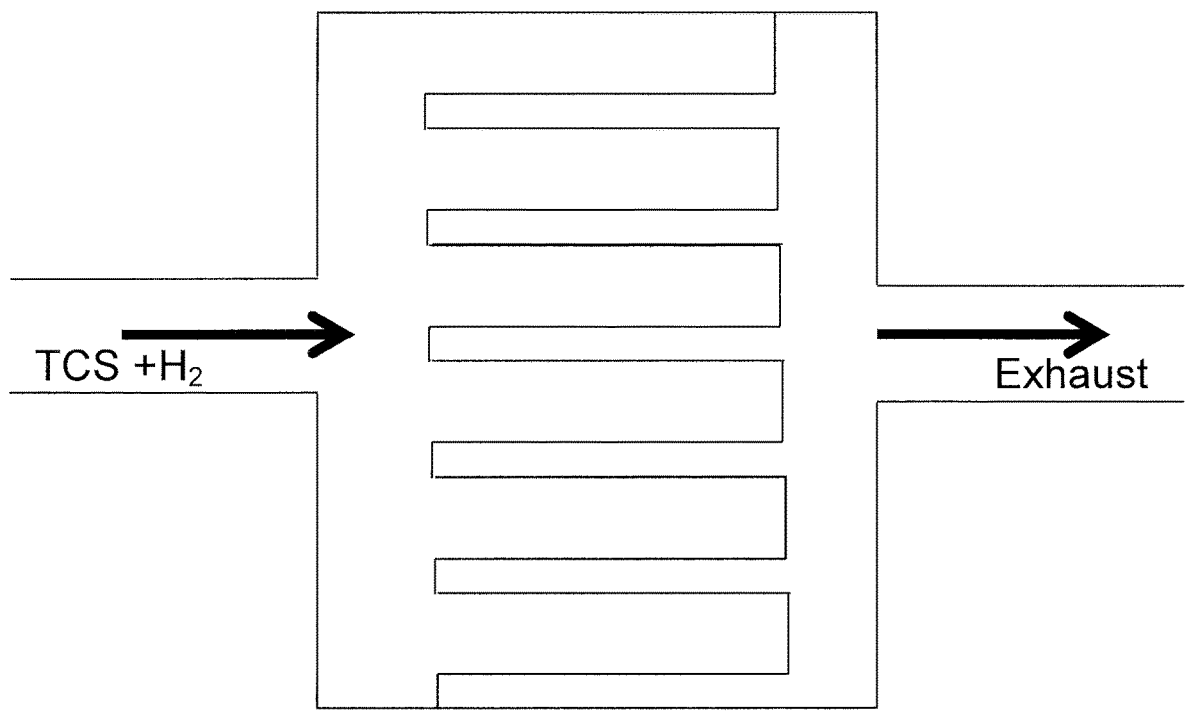
FIGS. 2A & 2B show top down and cross-sectional views, respectively, of a representation of a first embodiment of a substrate carrier also showing the separation of gas flows between even and odd channels within the substrate carrier, according to some embodiments of the present invention.
Figure 2B:
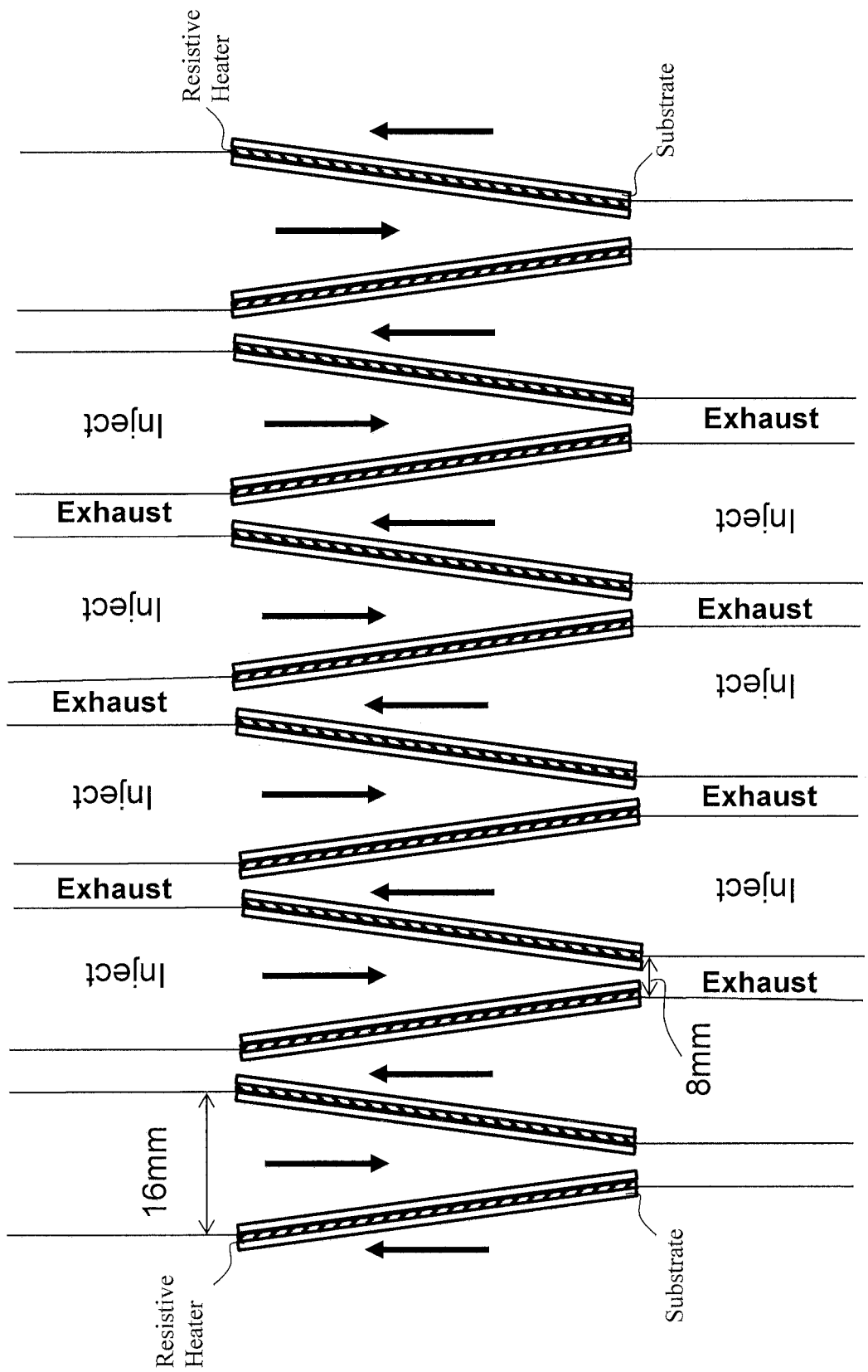

FIGS. 2A & 2B show top down and cross-sectional views of a representation of a first embodiment of a substrate carrier also showing the separation of gas flows between even and odd channels within the substrate carrier. It is important to note that the gas flow direction is opposite for immediately adjacent channels—gas flow is "up" (from gas inject to gas exhaust) in odd channels and "down" in even channels in FIG. 2B; this process gas "counterflow" is important for maintaining a sufficiently uniform substrate surface temperature during deposition on the substrate surfaces exposed to the process gas. The walls separating adjacent channels are seen to be formed of electrically resistive heaters which directly heat the substrates. Counterflow results in heating of the injected process gas by the exhaust gas through the walls of the runway—see for example FIG. 4B. The channel width and angles of substrates are merely examples—actual channel width and substrate angles can be optimized for particular depositions. Note that holding the substrates at an angle to the process gas flow is done to compensate for depletion of reactants in the process gas along the direction of process gas flow across the substrate surfaces.

FIGS. 3A & 3B show cross-sectional views of a representation of a second embodiment of a substrate carrier also showing the separation of gas flows between even and odd channels within the substrate carrier. Due to the substrates being mounted parallel to the gas flow direction there may be some effects on the deposition uniformity due to depletion; to compensate for the effects of depletion the direction of gas flow is reversed part way through film deposition—this is represented by the "$1^{st}$ cycle" and "$2^{nd}$ cycle". Flow switching requires further complexity in the gas manifold design, as discussed below.

Figure 4A:
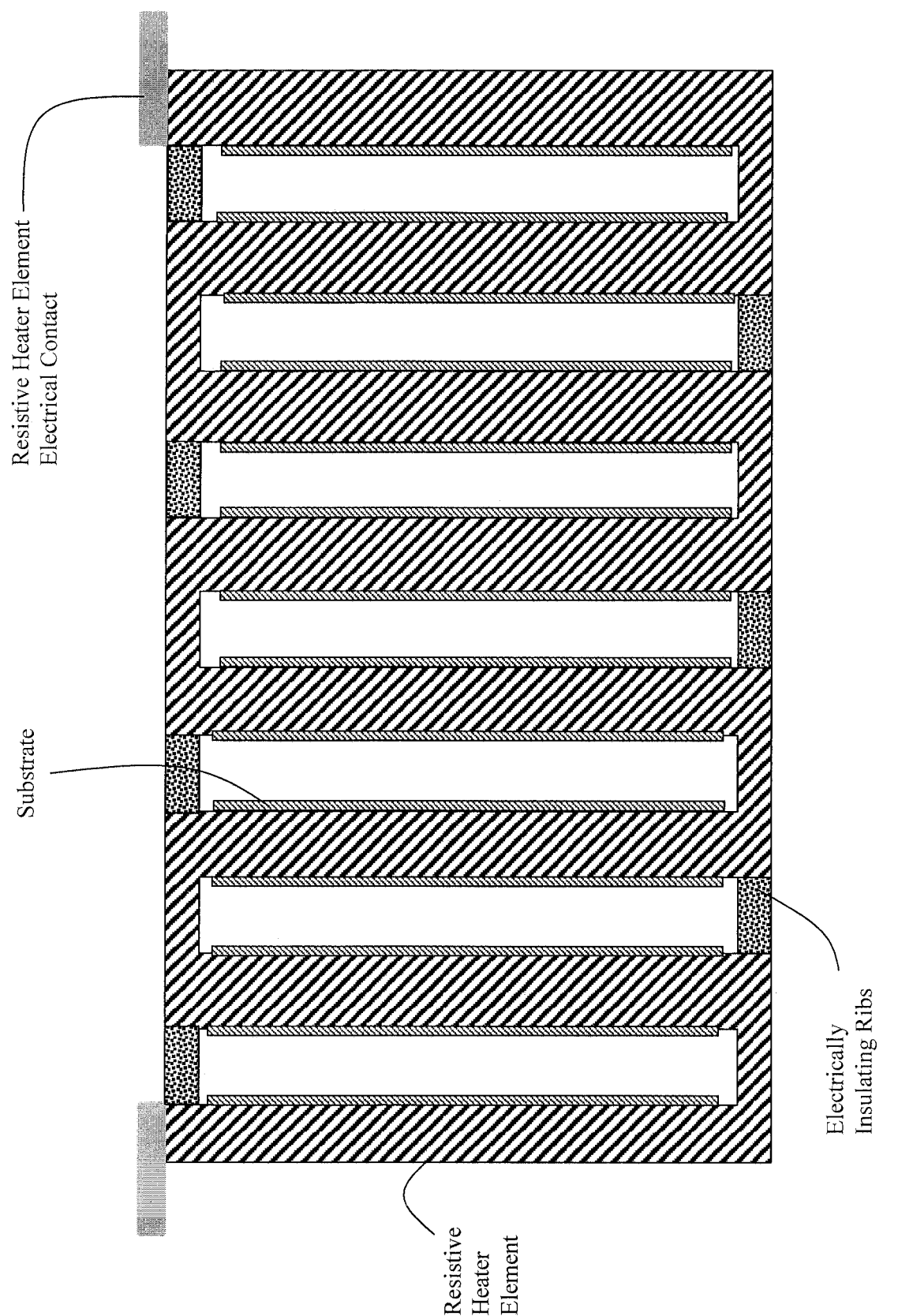
FIGS. 4A & 4B show cross-sections of an embodiment of a substrate carrier in horizontal and vertical planes, respectively, according to some embodiments of the present invention.
Figure 4B:
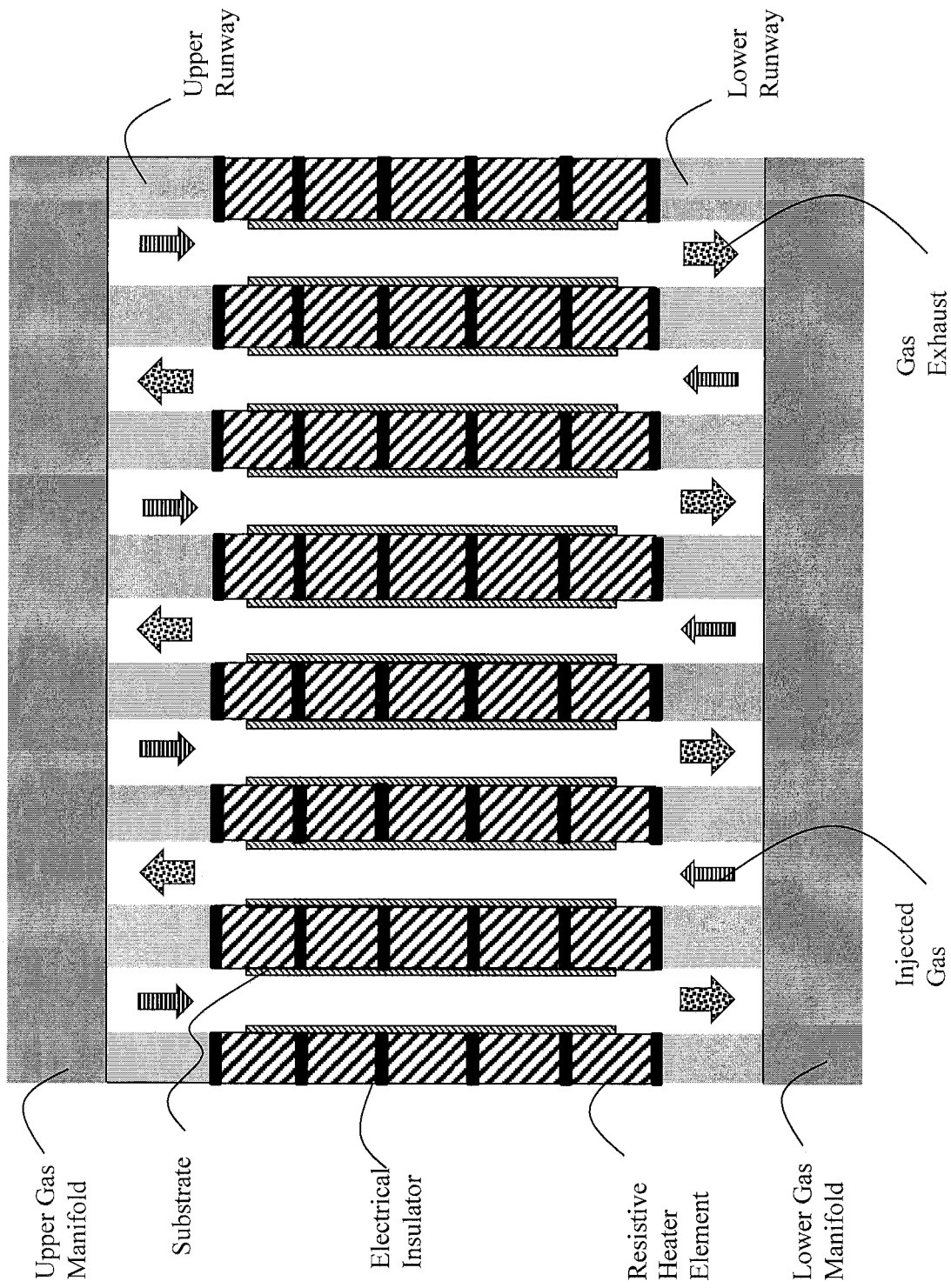

FIGS. 4A & 4B show cross-sections of an embodiment of a substrate carrier in horizontal and vertical planes, respectively. The electrically resistive heater elements are seen to have a serpentine shape in the horizontal plane, allowing for one element to service multiple channels. As an example, the electrically resistive heating elements may be made of graphite CVD coated with SiC, available from Toyo Tanso USA, Inc. Electrical contacts at the ends of the element allow for interconnection of multiple elements in either series or parallel and also allow for electrical connection to a power supply by using clamps, as described below. Note the electrically insulating ribs that are used to complete the channels, and the substrates mounted to the heating elements within each channel. The electrically insulating ribs may be made of quartz, graphite covered in BN, or quartz covered in SiC, for example. FIG. 4B shows how multiple resistive elements may be stacked together and separated by electrical insulators, thus allowing for independent control of each element if needed to maintain a uniform temperature over the substrate surfaces. Note the upper and lower runways which allow for heat exchange between gases in adjacent channels, as discussed above. Furthermore, the thickness of the resistive elements may be varied as needed to create regions which generate more or less heat (due to greater or lesser resistance, respectively).

Furthermore, FIG. 4B shows an example of an electrically resistive heater structure comprising 5 electrically resistive heating elements which may correspond to 5 heating zones, where the heat generated from each element can be controlled separately by controlling the current passing through each element. The concept of different heating zones is discussed in more detail in Pat. Appl. Publ. Nos. US 2010/0215872, US 2010/0263587 and US 2013/0032084, all incorporated by reference herein in their entirety. Note that along the gas flow direction a single substrate is shown attached to the resistive elements—in some embodiments the single substrate is preferred, although other embodiments may have multiple substrates attached to the resistive elements along the direction of gas flow.

Figure 5:
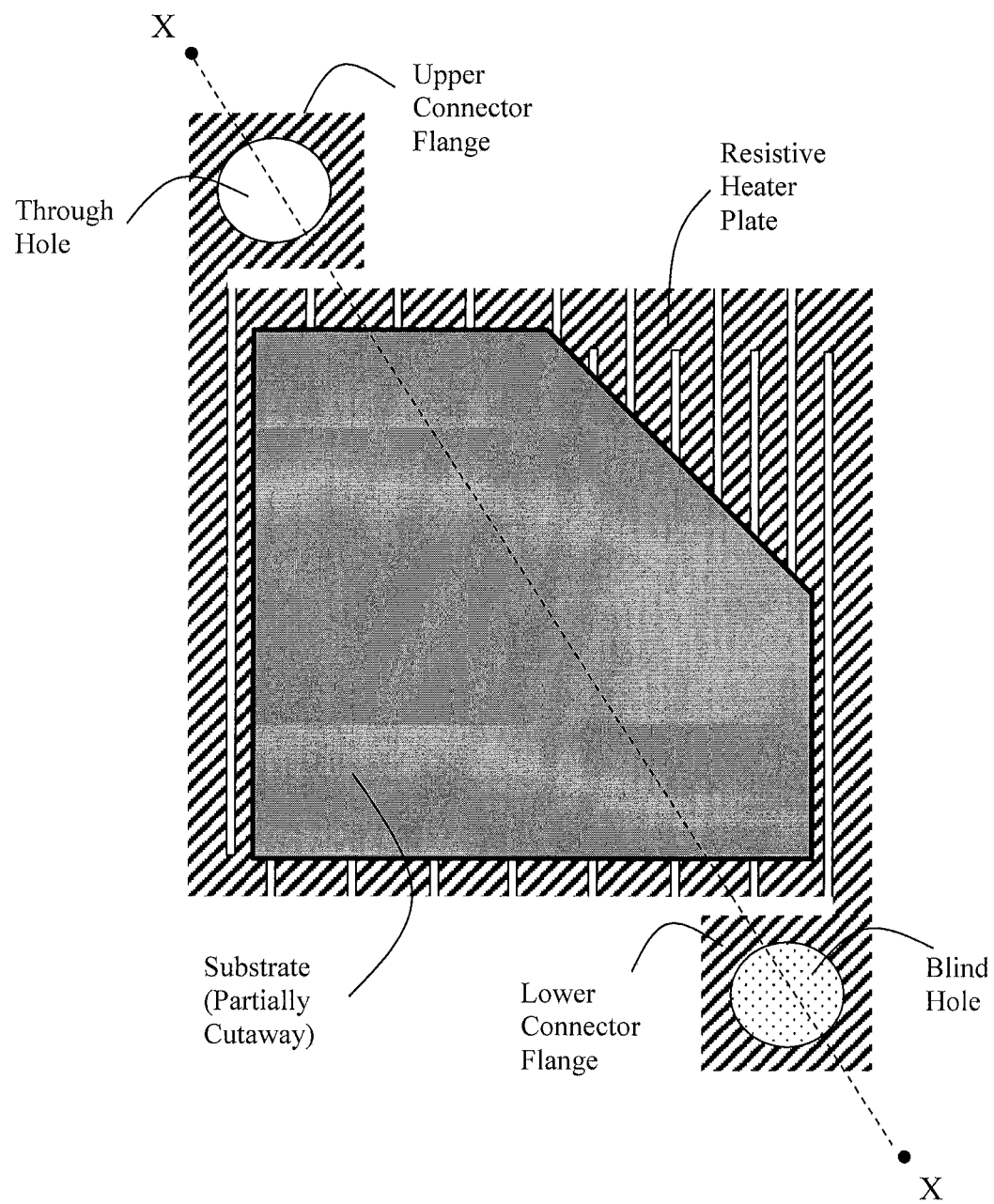
FIG. 5 shows a different embodiment of the electrically resistive heater, where the wall between adjacent channels may be formed from a single heating element, which is shown to have a serpentine configuration, according to some embodiments of the present invention.
Figure 6:
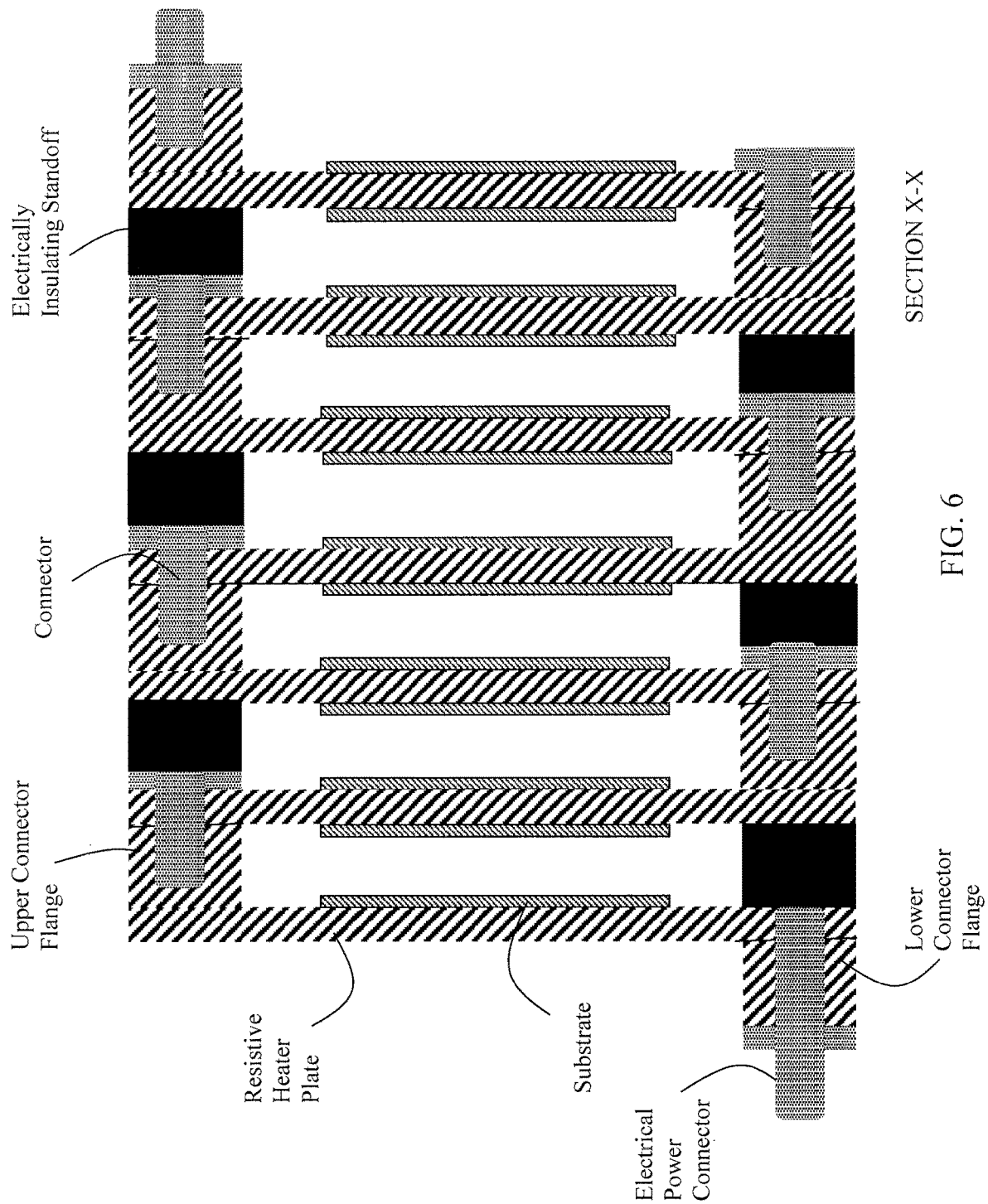
FIGS. 6 & 7 are cross-sectional views which provide examples of how the heating elements of FIG. 5 may be combined to form a substrate carrier, according to some embodiments of the present invention.
Figure 7:
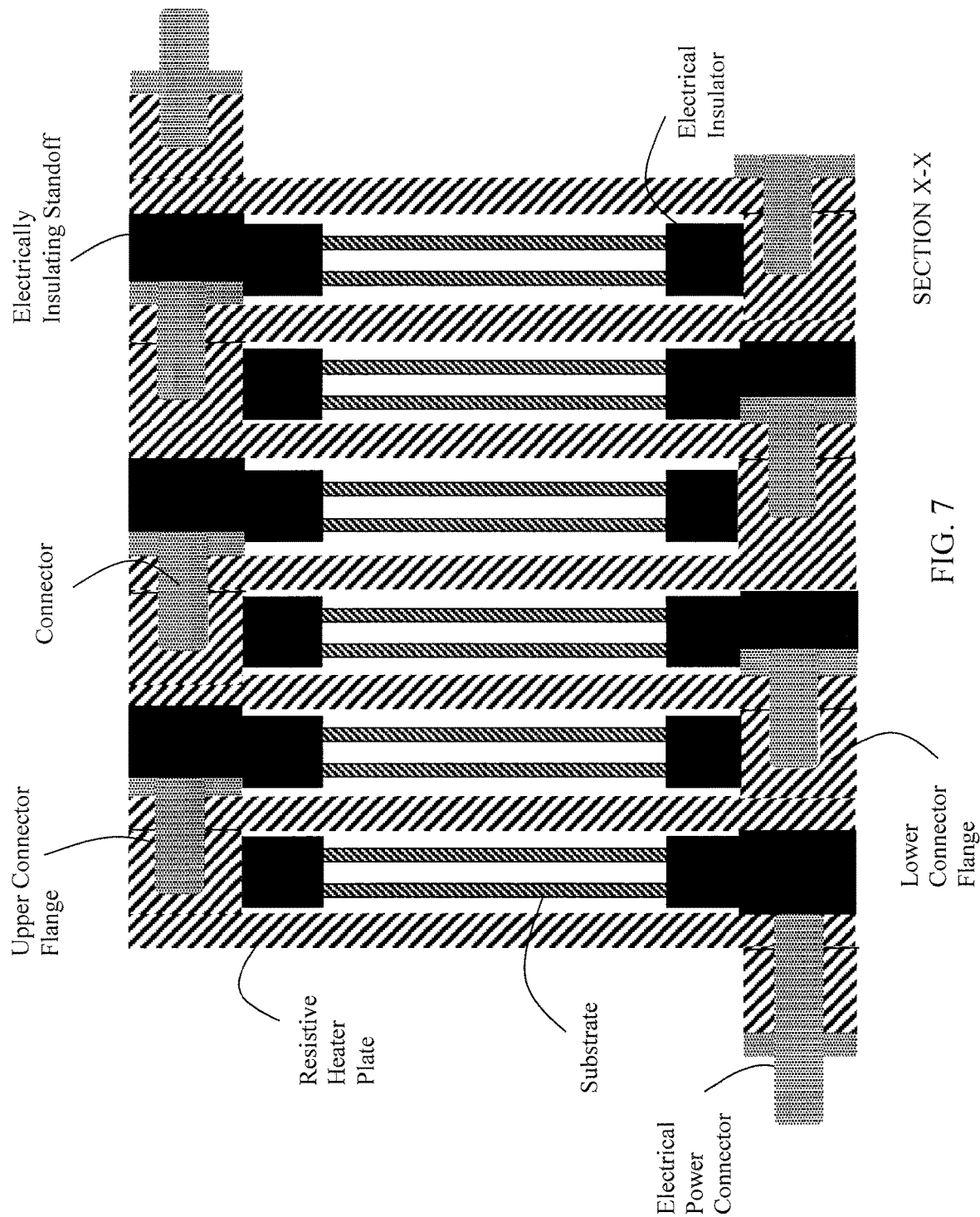

FIG. 5 shows a different embodiment of the electrically resistive heater—the wall between adjacent channels may be formed from a single heating element, which is shown to have a serpentine configuration. The substrate is shown in a mounting position, and is partially cut-away to show the details of the serpentine configuration of the element. FIGS. 6 & 7 are cross-sectional views which provide examples of how heating elements of FIG. 5 may be combined to form a substrate carrier. Electrically conductive connectors, insulating standoffs and power connectors are used to combine the elements in series in the examples provided. Note that FIG. 7 shows a wafer holder specifically for double-sided deposition on substrates—here 2 substrates are shown per channel, although it may be possible to include more than 2 substrates per channel providing uniform substrate temperature can be maintained for all substrates during deposition; furthermore, substrates could also be mounted on the heating elements and undergo single-sided deposition while double-sided deposition is being done.

Figure 8A:
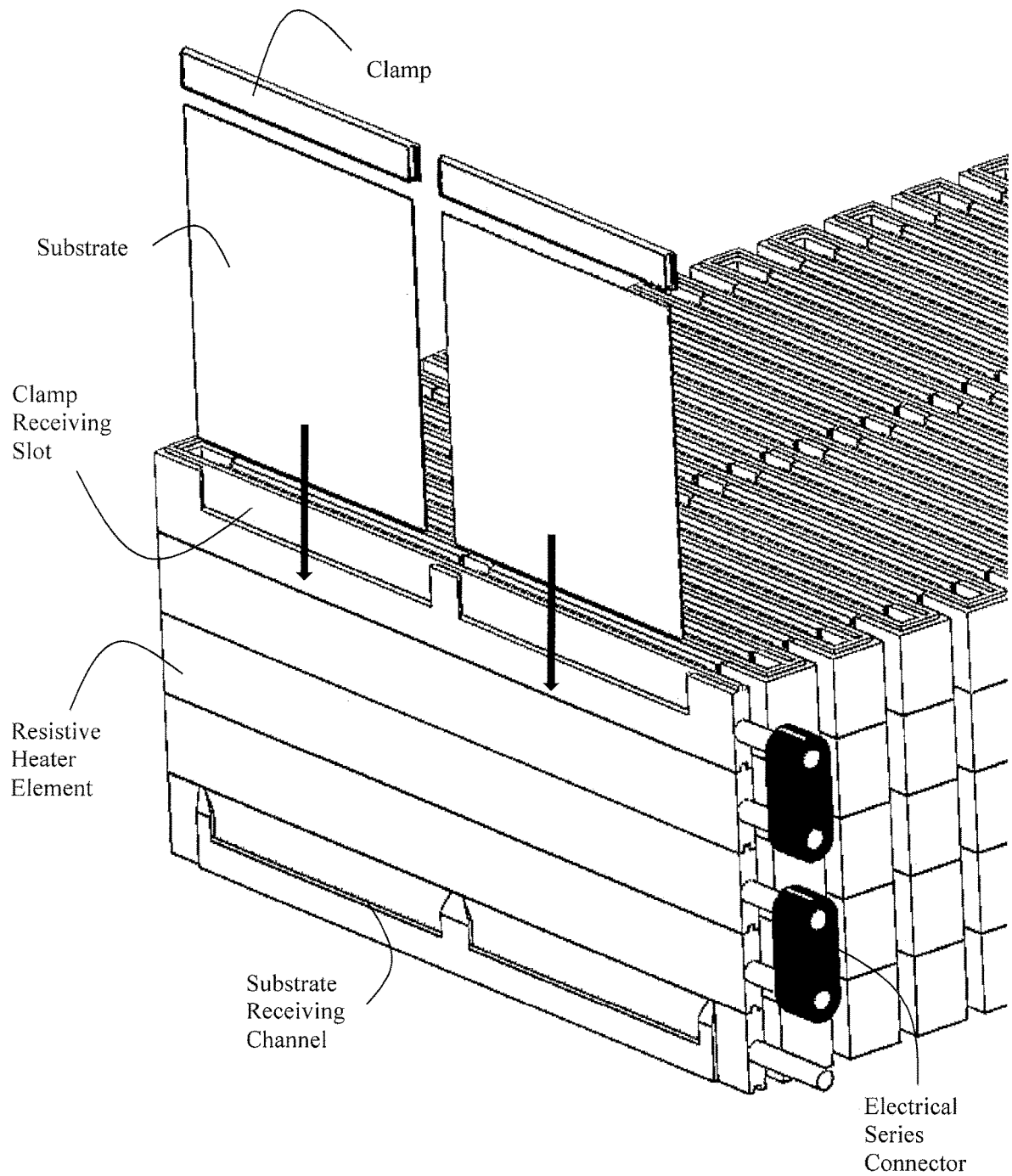
FIGS. 8A, 8B & 8C are perspective views showing more details of a substrate carrier, according to some embodiments of the present invention.
Figure 8B:
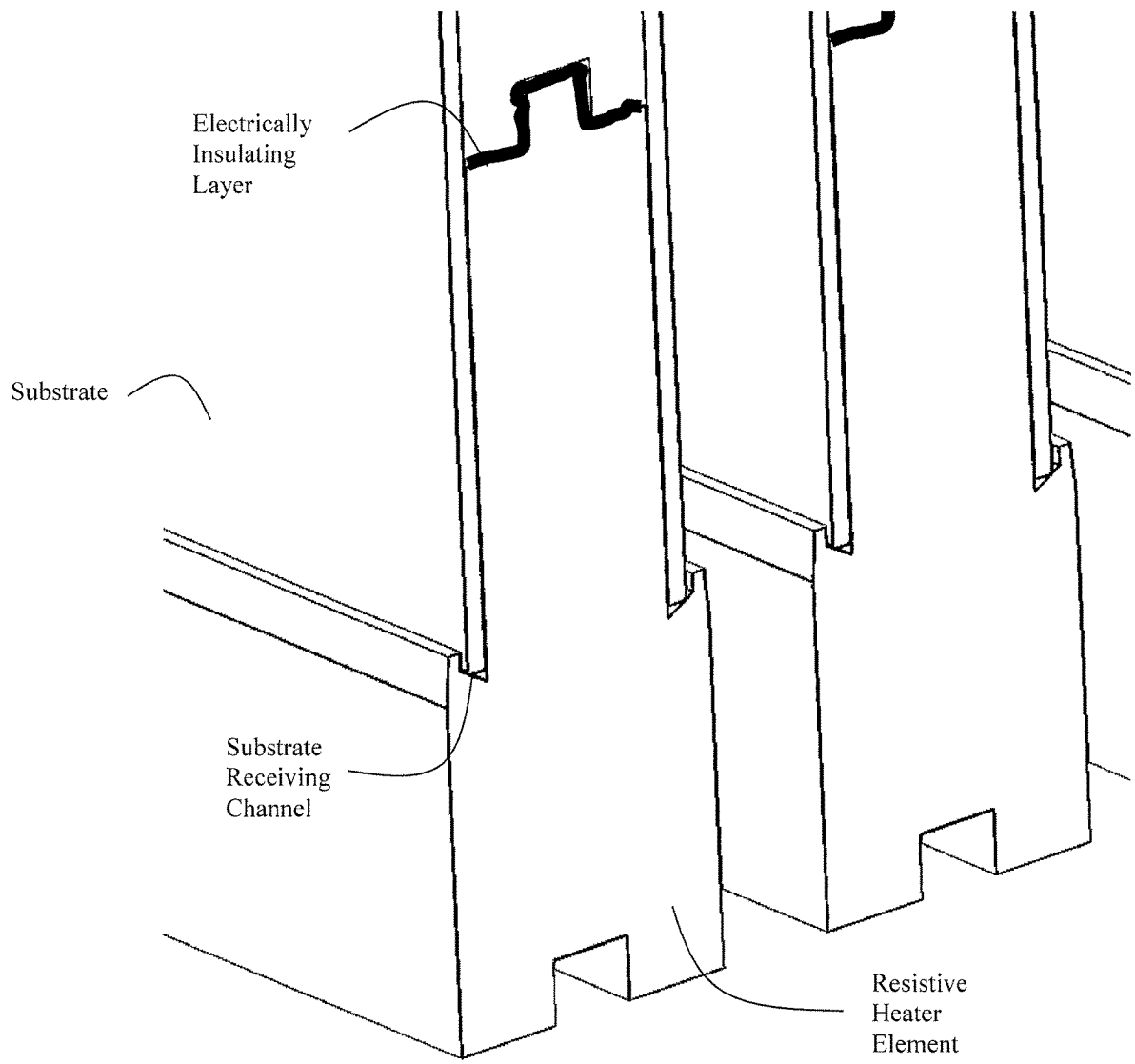
Figure 8C:
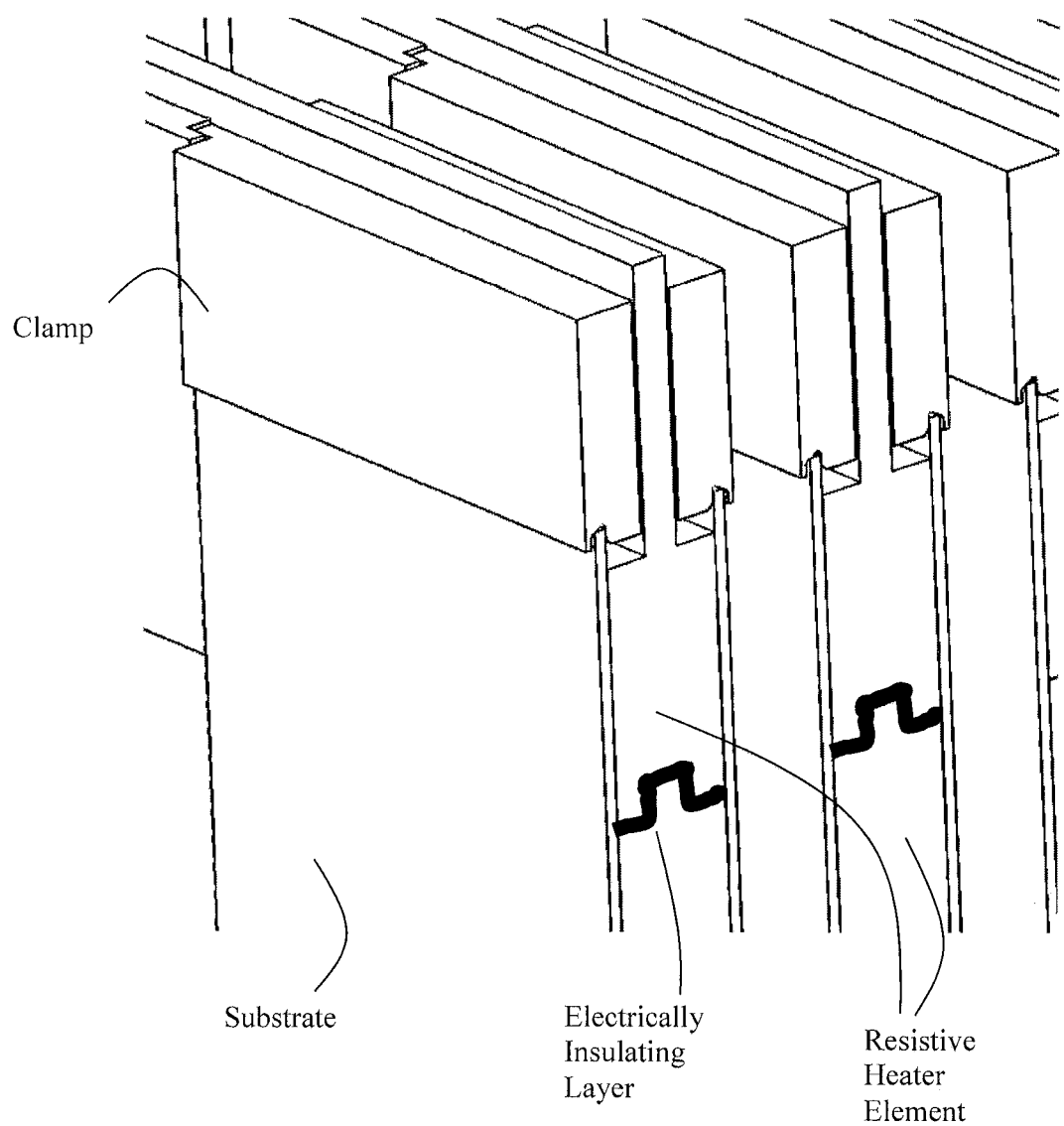

FIGS. 8A, 8B & 8C are perspective views showing more details of a substrate carrier, particularly one example of substrate mounting. Two substrates are shown in FIG. 8A being dropped into place in receiving slots followed by dropping clamps in position to secure the substrates. The sectional views of FIGS. 8B & 8C show details of how the substrate fits into the receiving slot and how the clamp fits into the clamp receiving slot and secures the substrate in place. Note that the receiving channels and clamp receiving slots may be formed in electrically resistive elements. Further note the example of series connectors for the heating elements and the electrically insulating layer between elements. Furthermore, to better accommodate electrically conductive substrates, and avoid shorting heating elements, in embodiments an electrically insulating plate may be placed between the substrate and the heating elements—for example, a SiC plate could be placed between a conductive silicon substrate and the heating elements. (Such a plate may also have the benefit of improving heating diffusion and thus temperature uniformity of the substrate.) Note also that the ridges at the top and bottom of heating elements may be varied form those shown in the figures, and that other configuration of insulators may be used between the elements—for example, an insulating rod may be used to electrically isolate the elements and the elements may have v-shaped notches to accommodate the rods.

Figure 9:
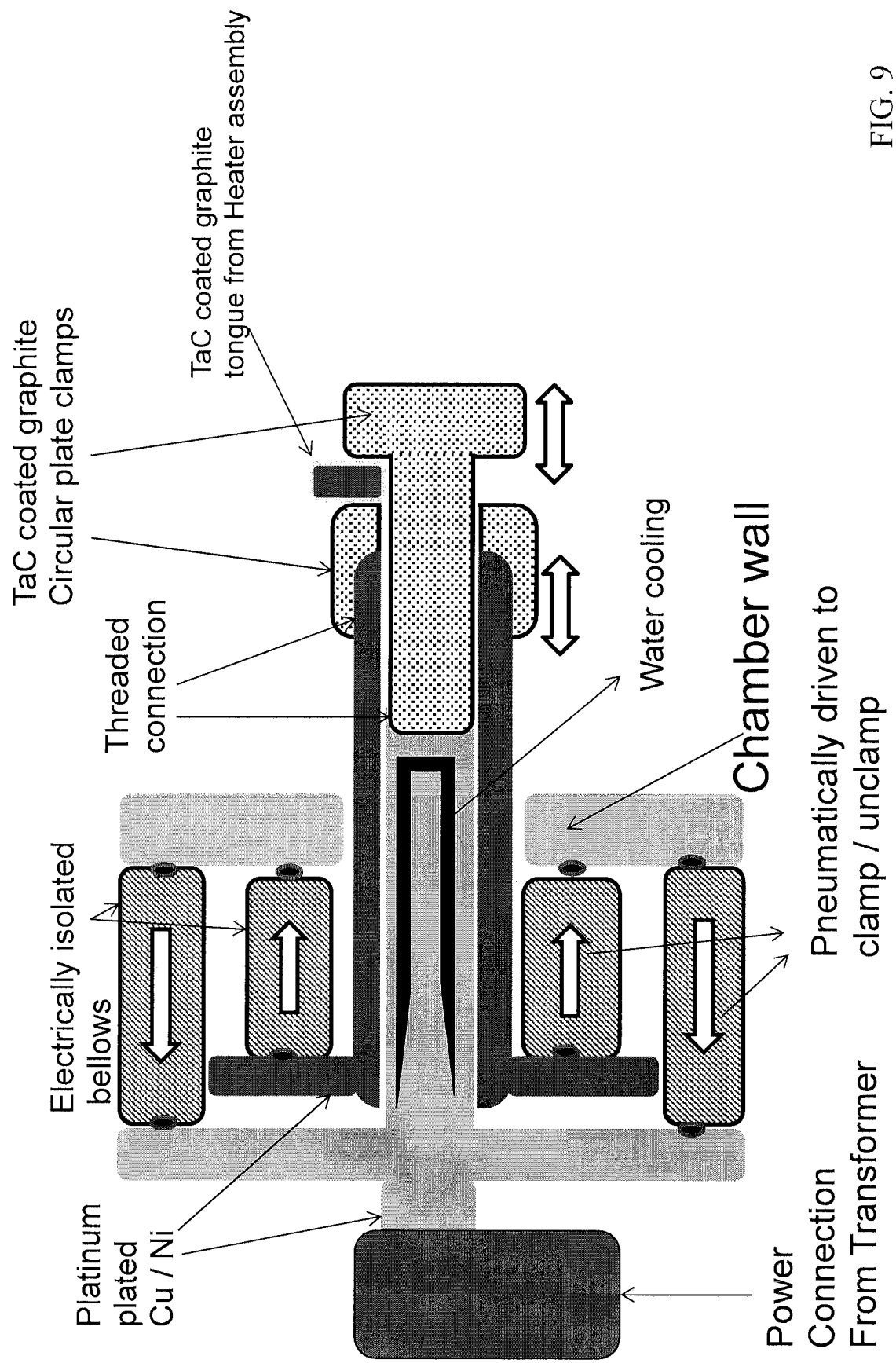
FIGS. 9 & 10 show representations of different examples of make-and-break clamps that may be used to provide electrical power to the electrically resistive heating elements, according to some embodiments of the present invention.
Figure 10:
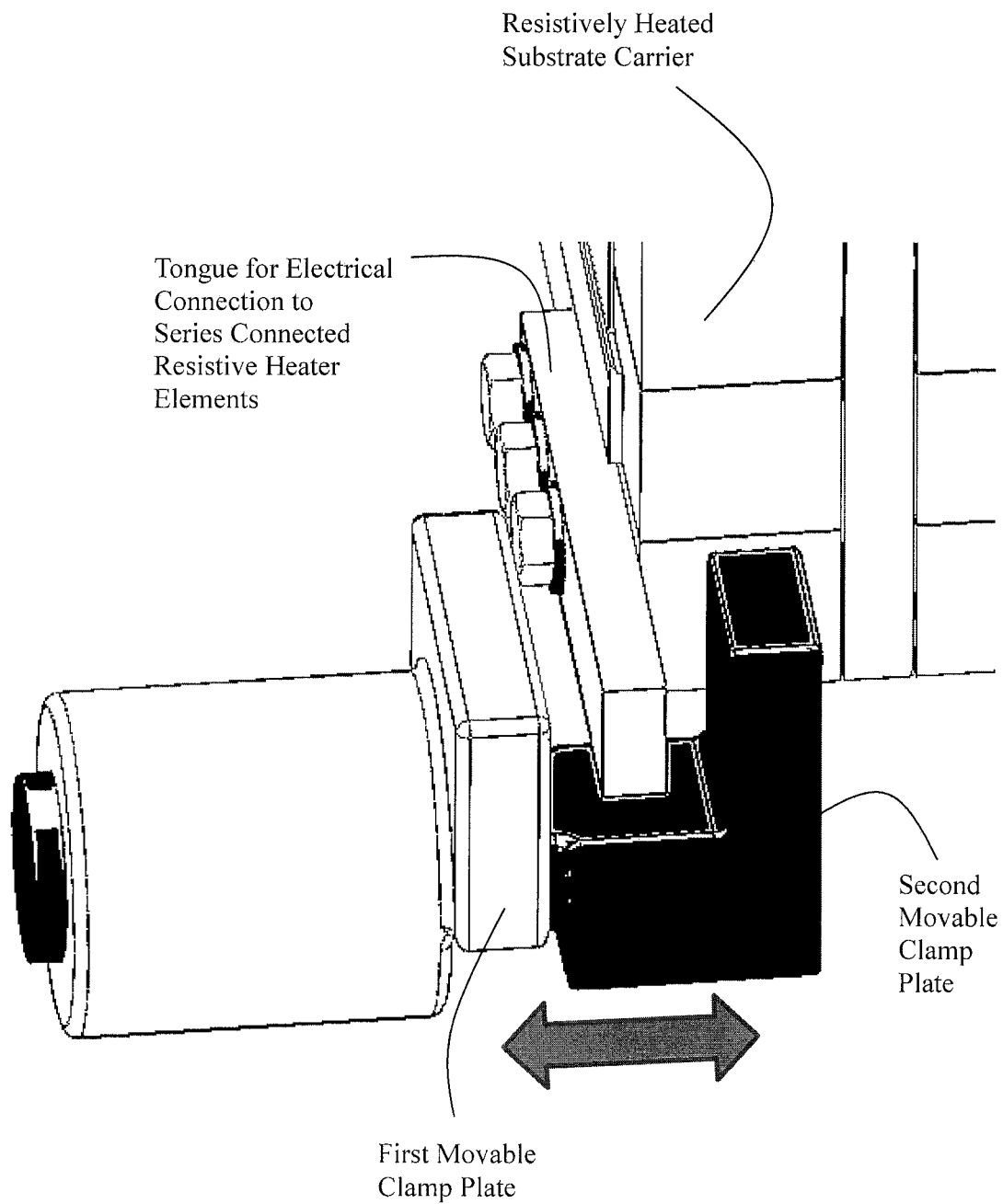

FIGS. 9 & 10 show examples of make-and-break clamps that may be used to provide electrical power to the electrically resistive heating elements. FIG. 9 shows a schematic representation of the clamp, showing the vacuum feedthrough, the mechanism for moving the clamp, water cooling, and some material choices. FIG. 10 shows a perspective view of the end part of a clamp positioned to clamp onto a tongue which is connected to an electrically resistive heating element of a substrate carrier.

Figure 11A:
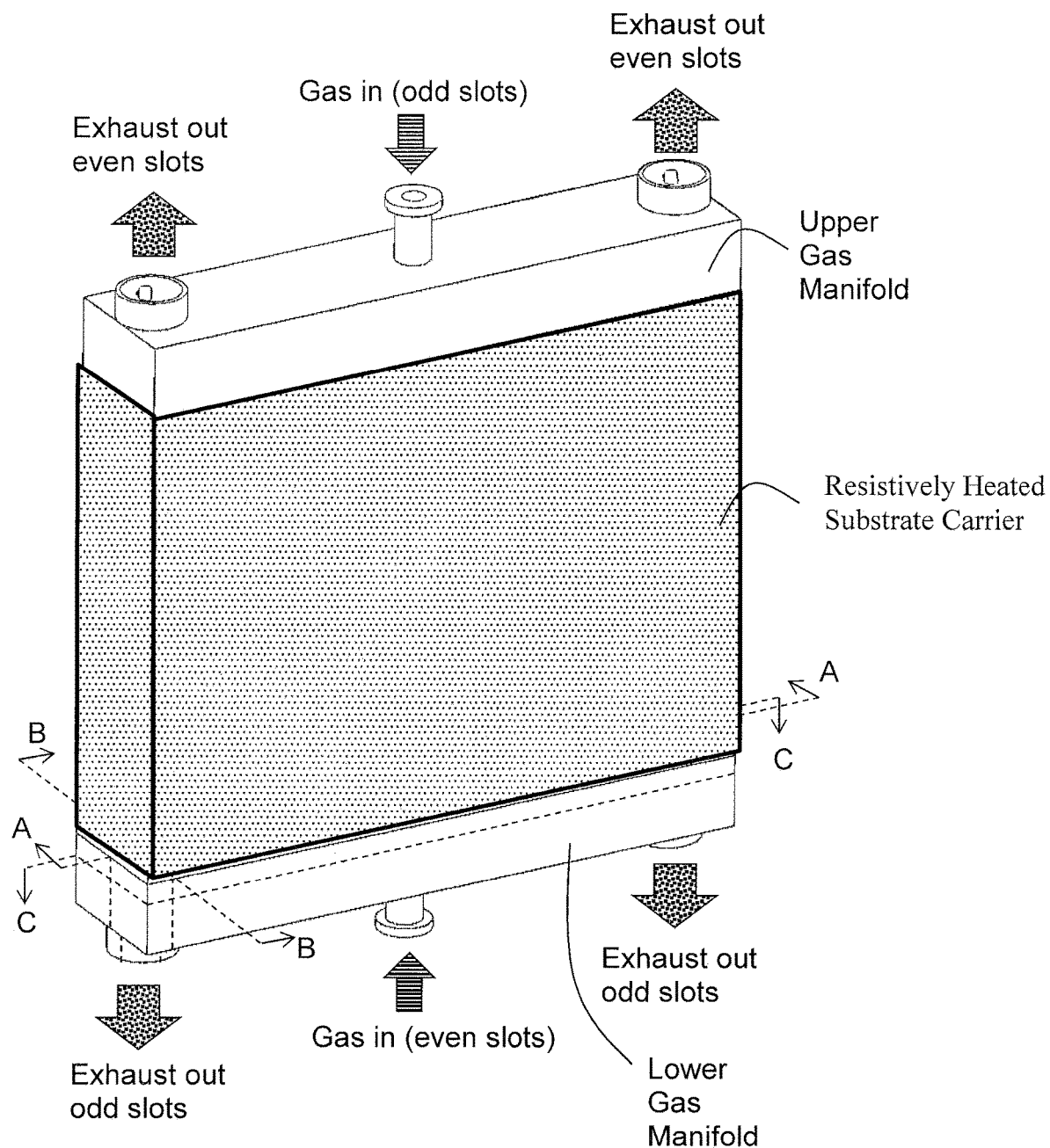
FIGS. 11A-11D show views of an example of a gas manifold suitable for use with a substrate carrier such as shown in FIG. 2B, which manifolds can accommodate gas counterflow, according to some embodiments of the present invention.
Figure 11B:
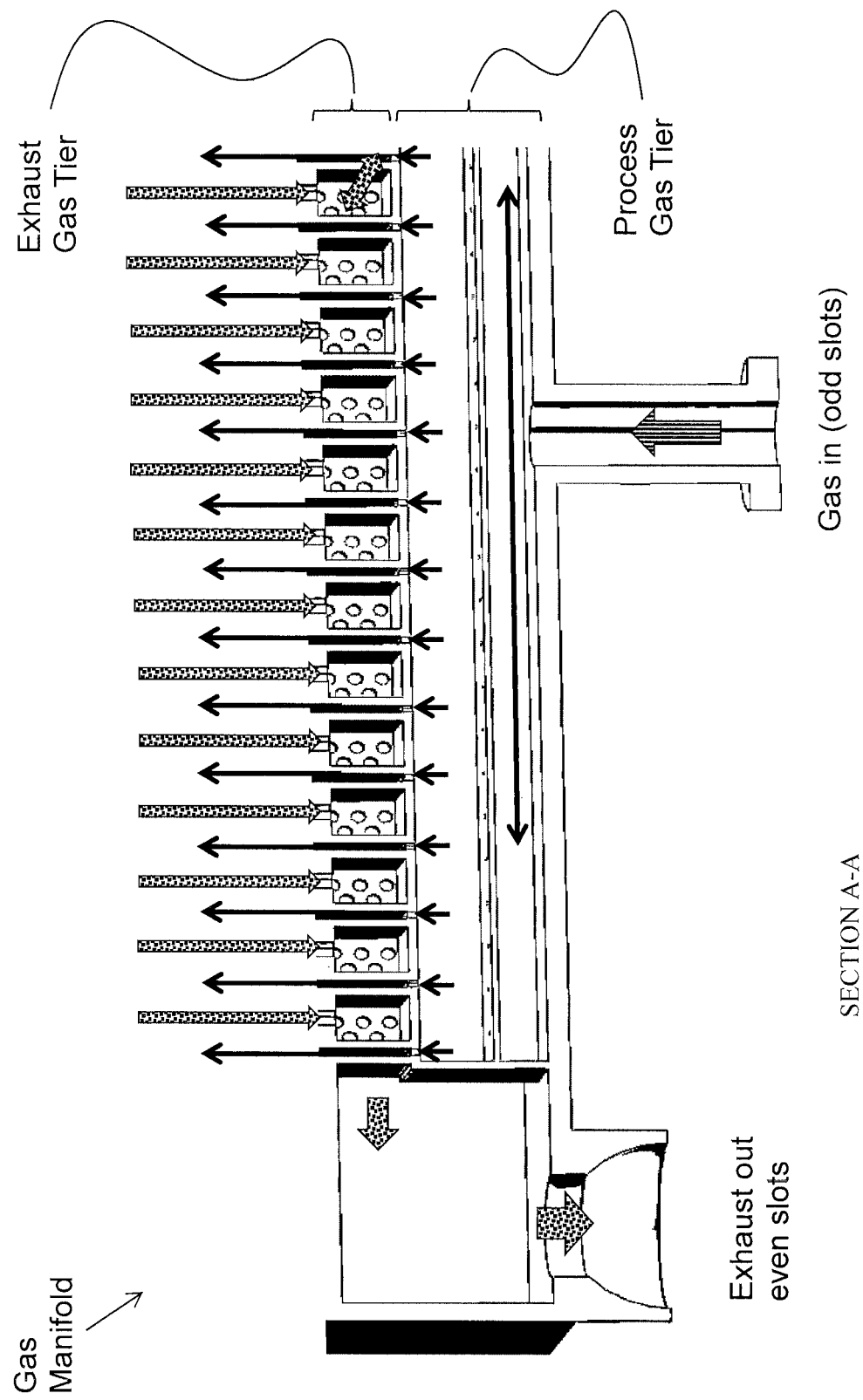
Figure 11C:
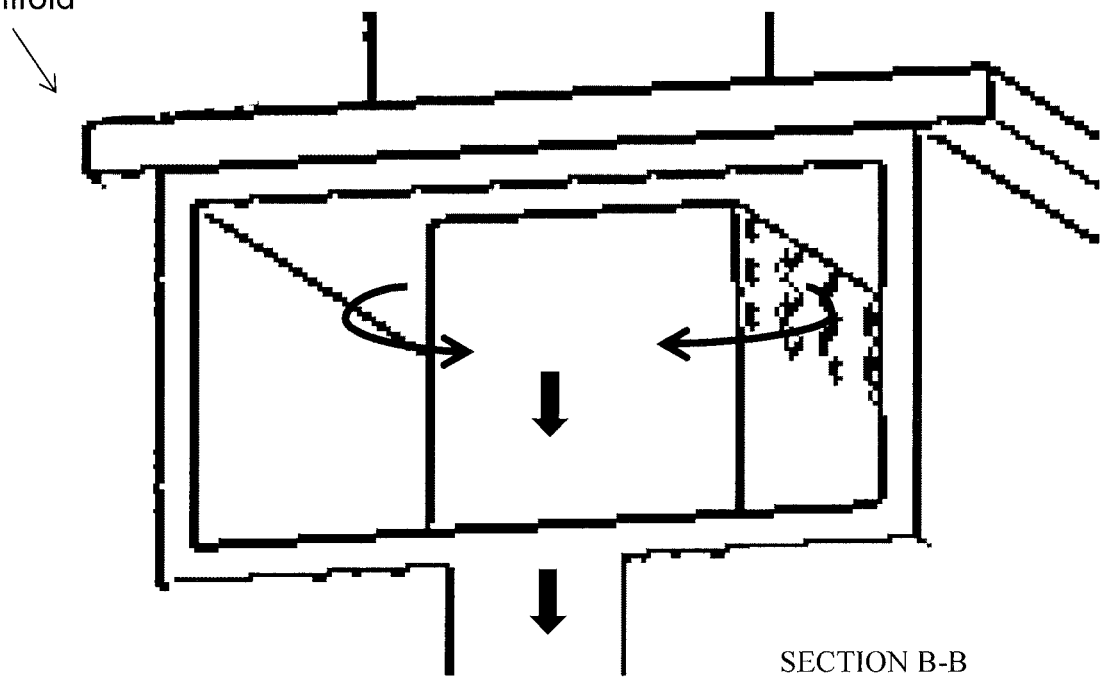
Figure 11D:
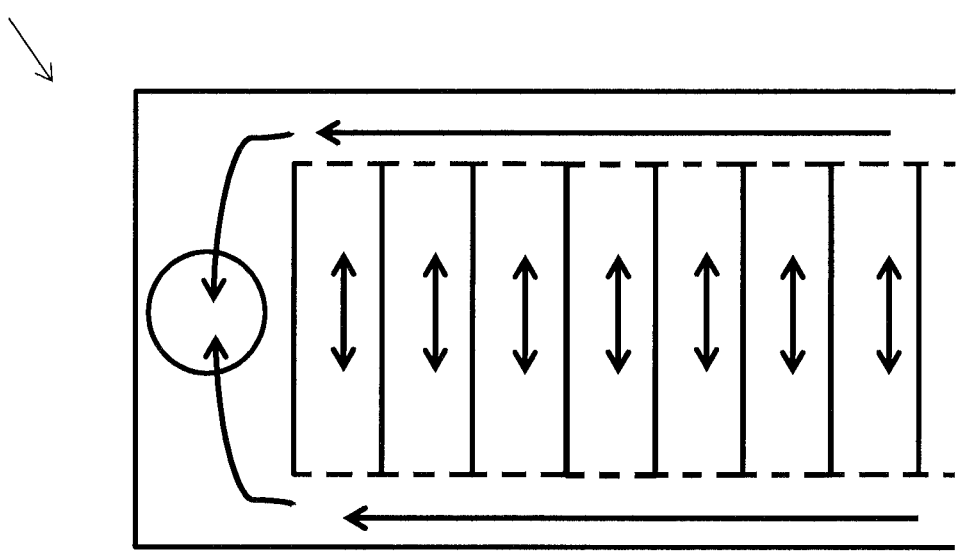

FIGS. 11A through 11D show views of an example of a gas manifold suitable for use with a substrate carrier such as shown in FIG. 2B, which manifolds can accommodate the counterflow. Note that in embodiments the manifolds and substrate carrier may have greater depth to accommodate large substrates, such as substrates in the range of 140 to 170 mm on a side. FIG. 11A is a perspective view of both upper and lower manifolds attached to a substrate carrier. FIG. 11B is a perspective view of a manifold cut along A-A. FIG. 11C is a perspective view of a manifold cut along B-B, showing exhaust gas flow. FIG. 11D is a cross-sectional view of plane C-C showing flow of exhaust gas through the exhaust gas tier of the manifold.

Figure 12A:
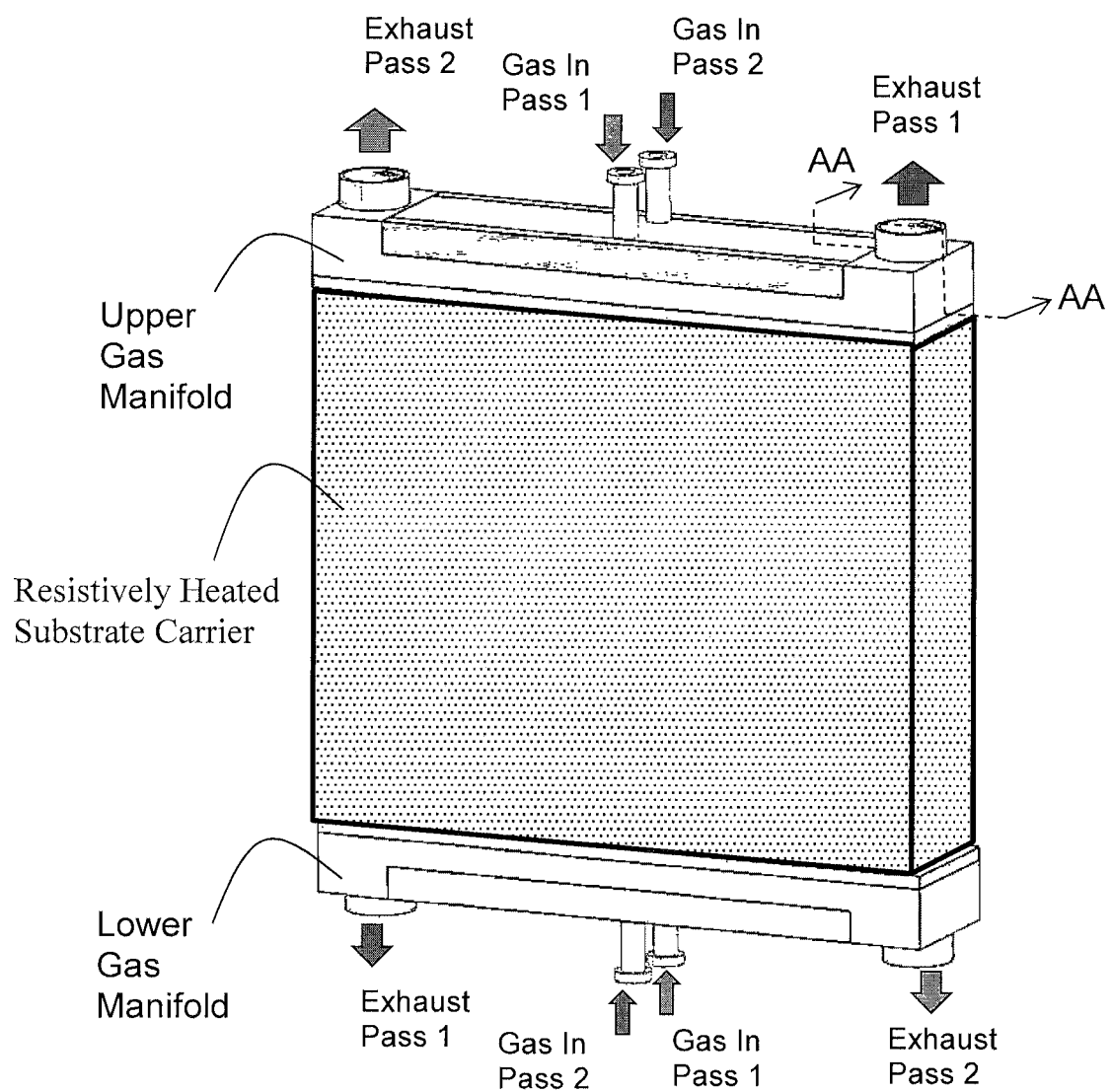
FIGS. 12A through 12D show views of an example of a gas manifold suitable for use with a substrate carrier such as shown in FIGS. 3A & 3B, which manifolds can accommodate gas counterflow and also flow switching, according to some embodiments of the present invention.
Figure 12B:
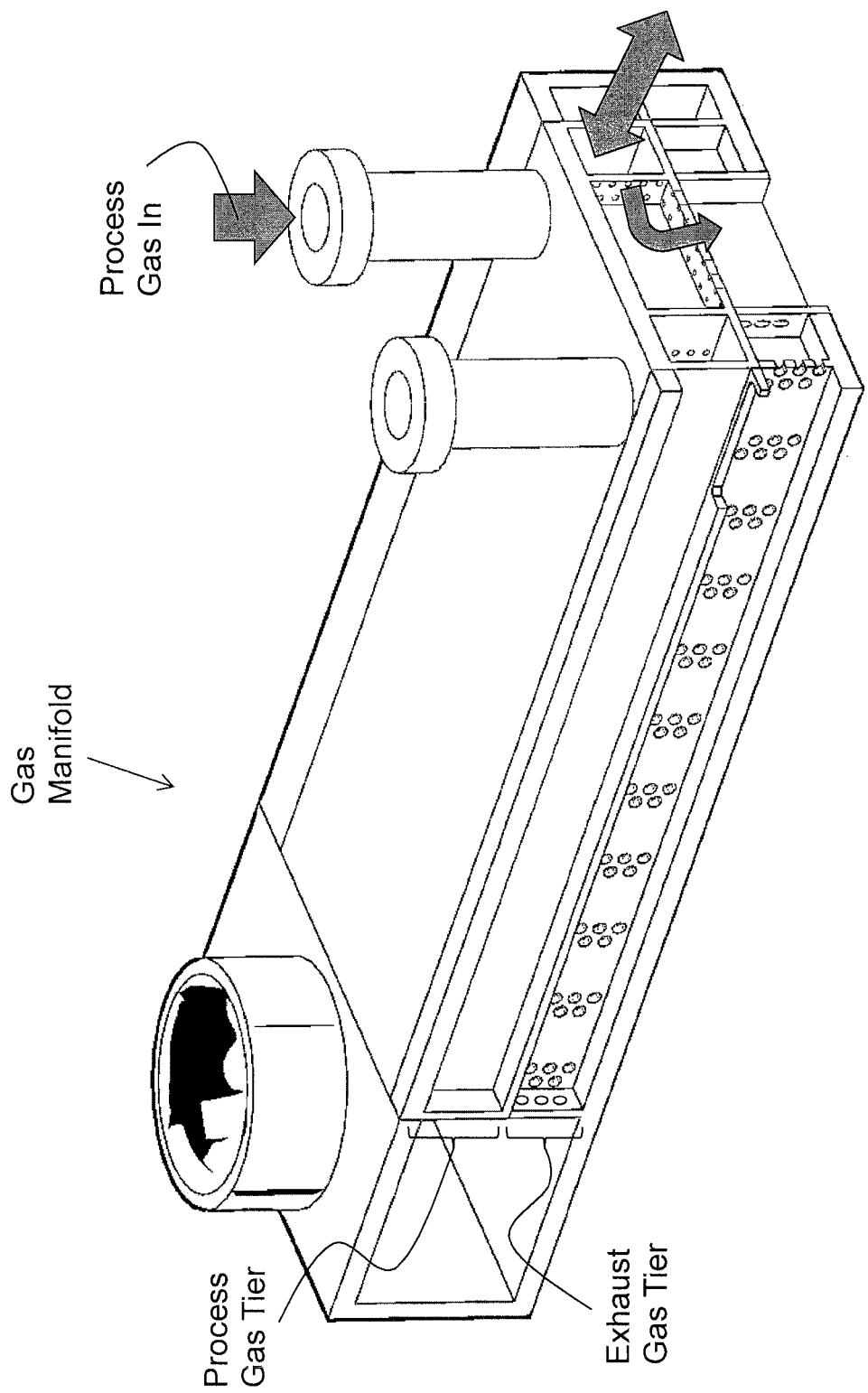
Figure 12C:
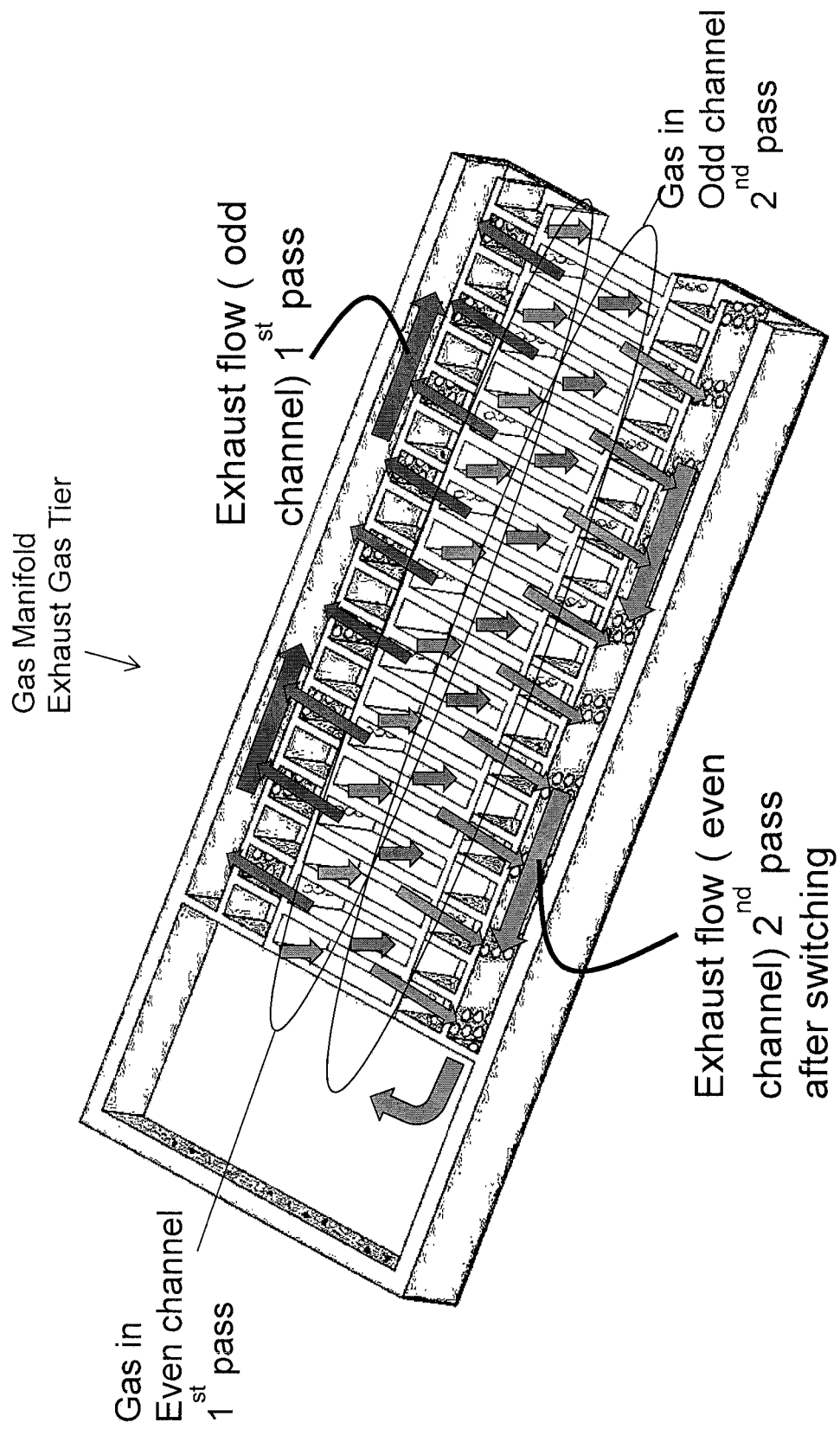
Figure 12D:
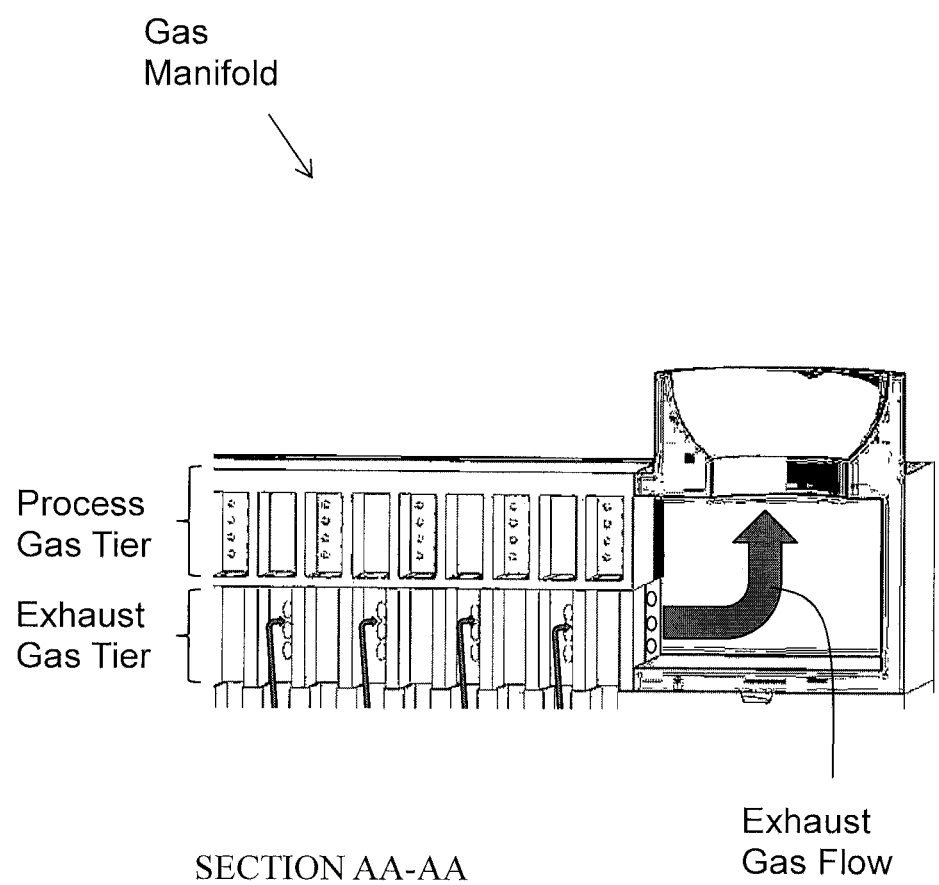

FIGS. 12A through 12D show views of an example of a gas manifold suitable for use with a substrate carrier such as shown in FIGS. 3A & 3B, which manifolds can accommodate the counterflow and also flow switching. Note that in embodiments the manifolds and substrate carrier may have greater depth to accommodate large substrates, such as substrates in the range of 140 to 170 mm on a side. FIG. 12A is a perspective view of both upper and lower manifolds attached to a substrate carrier. FIG. 12B is a perspective view of the upper gas manifold with front and end cut-away showing the flow of process gas through one of the two process gas intakes and through the manifold. FIG. 12C is a perspective view of the exhaust gas tier of the upper gas manifold, showing exhaust gas flows, and the flows of process gases from the process gas tier through the exhaust gas tier toward the substrate carrier. FIG. 11D is a perspective view of the end of the upper gas manifold cut along AA-AA, showing the flow of exhaust gas through the exhaust gas tier of the manifold and out of the manifold.

Figure 13:
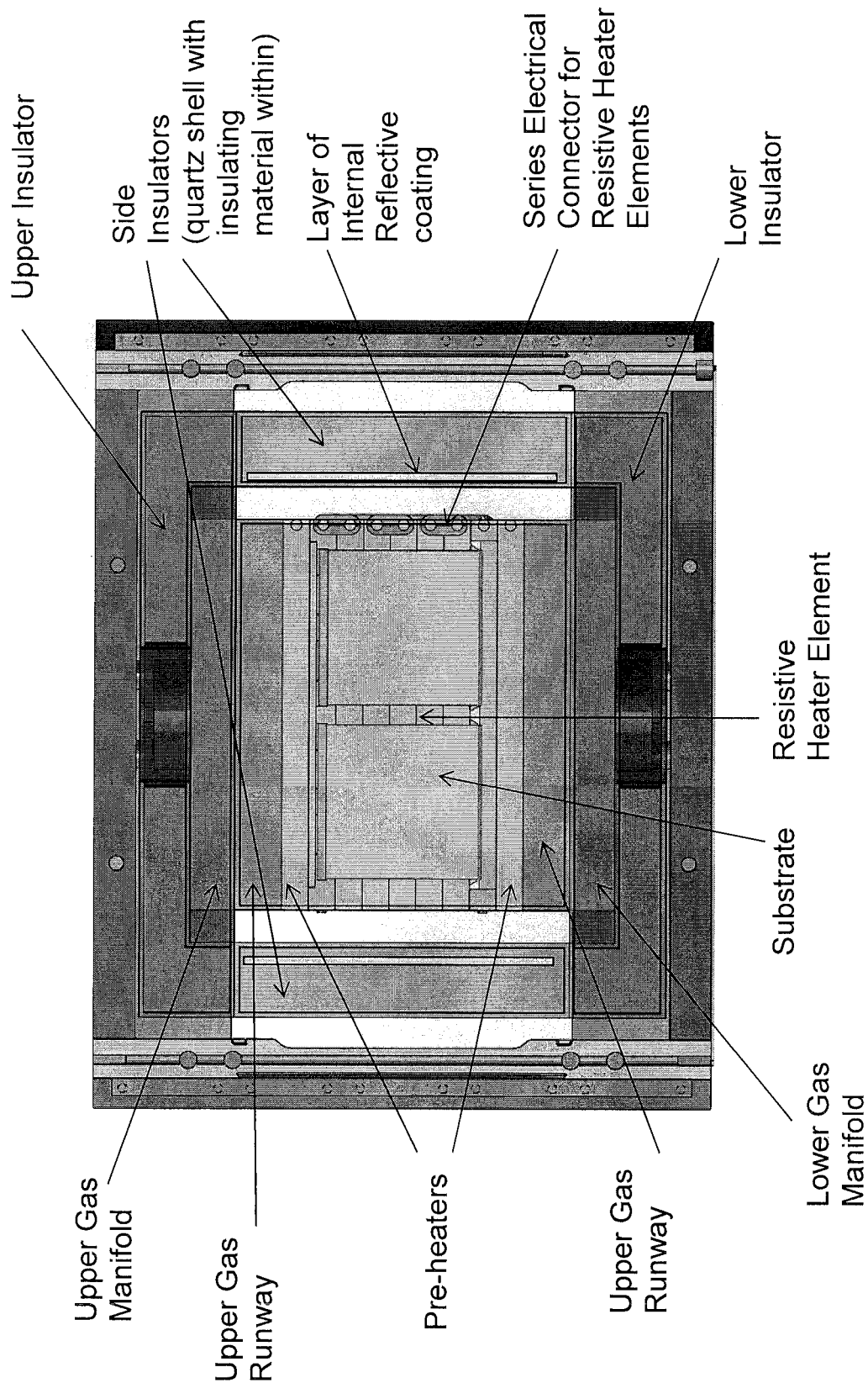
FIG. 13 shows a front view of a substrate carrier in a CVD reactor according to some embodiments of the present invention, according to some embodiments of the present invention.

FIG. 13 shows a front view of a substrate carrier in a CVD reactor according to some embodiments of the present invention, where thermally insulating blocks are attached to the interior of the vacuum chamber. These blocks may comprise quartz shells and be filled with other thermally insulating materials; furthermore, reflective coatings may be applied to the interior side of the quartz shell to improve reflection of heat.

Figure 14A:
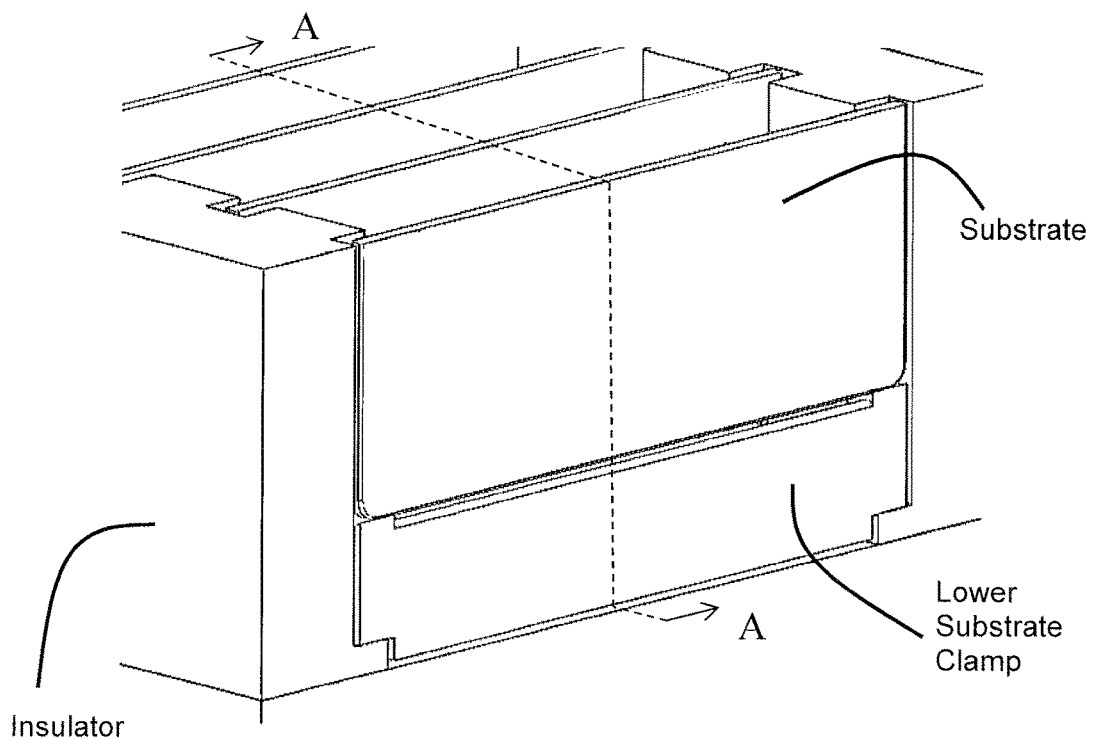
FIG. 14A is a cut-away perspective view of a two-sided deposition substrate holder, according to some embodiments of the present invention.
Figure 14B:
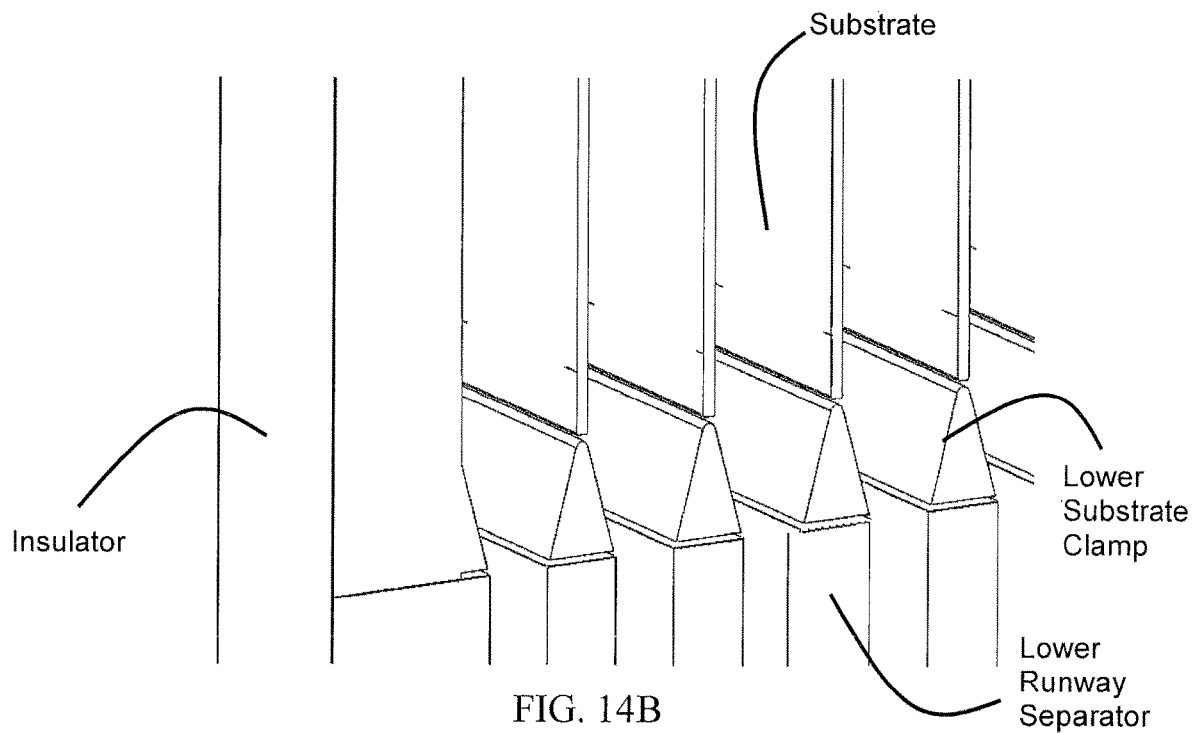
FIG. 14B is a cut-away perspective view of a cross-section along A-A of the substrate holder of FIG. 14A, according to some embodiments of the present invention.
Figure 14C:
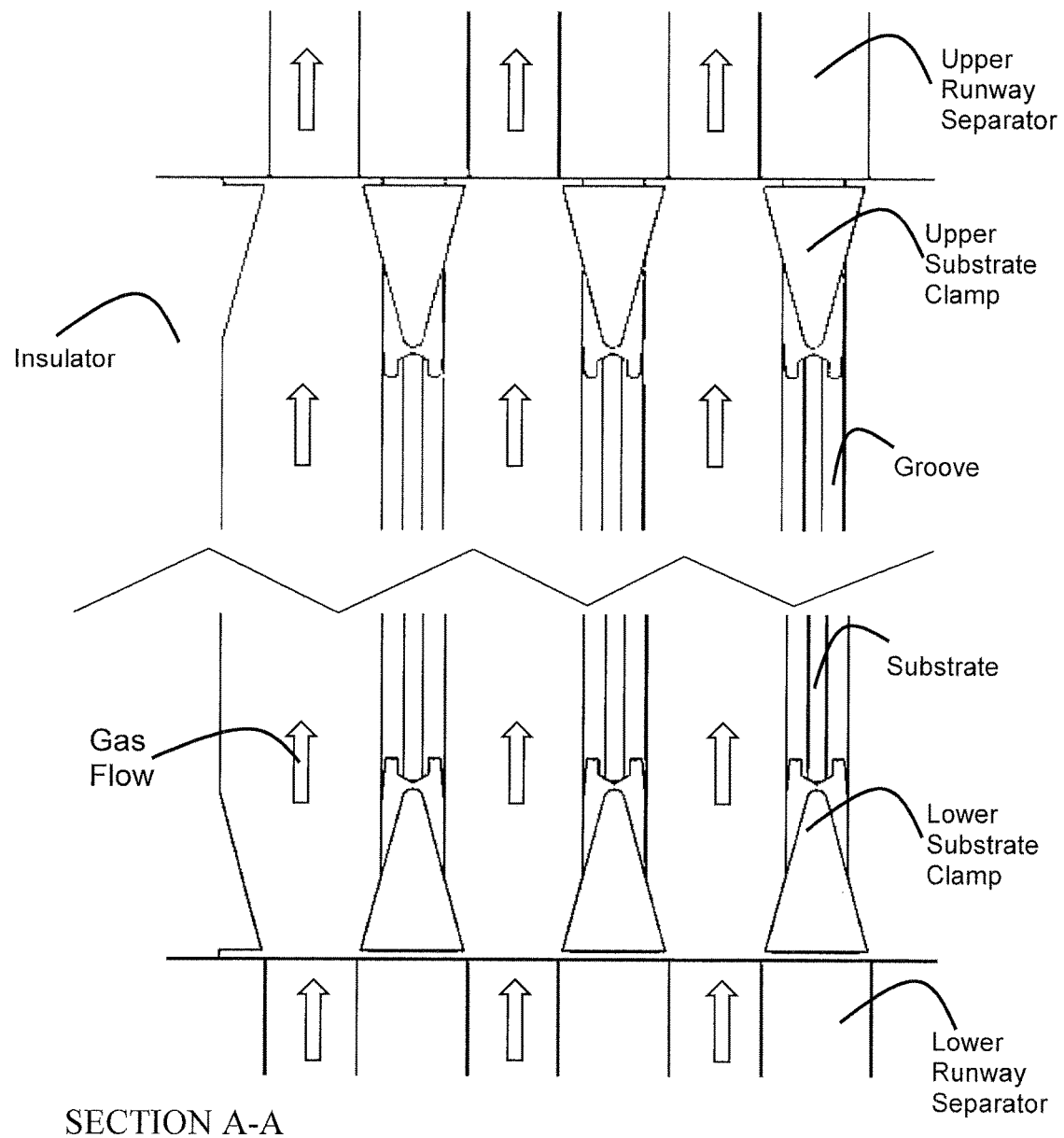
FIG. 14C is a view of a cross-section along A-A of substrate holder of FIG. 14A and including upper and lower runways, according to some embodiments of the present invention.
Figure 14D:
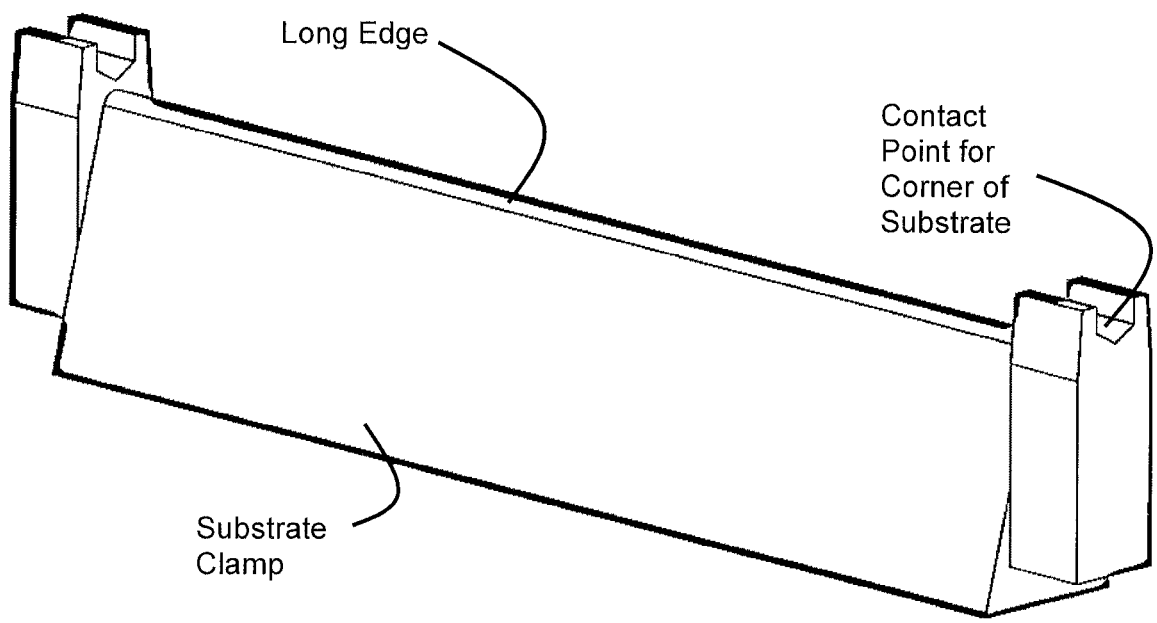
FIG. 14D is a detailed perspective view of the substrate clamp of FIGS. 14A-14C, according to some embodiments of the present invention.

In further embodiments a substrate carrier for two-sided substrate processing is provided in FIGS. 14A-14D. Such a substrate carrier may be suitable for use in the embodiment of FIG. 7, for example, and may be used for two substrates per channel, as shown in FIG. 7, and in embodiments with more than 2 substrates per channel. FIG. 14A is a cut-away perspective view of a substrate carrier, FIG. 14B is a cut-away perspective view of a cross-section along A-A of the loaded substrate carrier of FIG. 14A, FIG. 14C is a view of a cross-section along A-A of the loaded substrate carrier of FIG. 14A, and including upper and lower runways, and FIG. 14D is a detailed perspective view of the substrate clamp of FIGS. 14A-C, all according to some embodiments of the present invention. In FIG. 14A only the lower part of the substrates and box cassette, and the lower substrate clamp are shown. In FIG. 14B the cross-section of the substrate clamps is clearly shown to be triangular, also the correspondence of the substrate clamps to the lower runway separators is shown. FIG. 14C shows a view from the section along A-A into the substrate carrier where the plane of the section is perpendicular to the substrates. The flow of process gases through the substrate carrier is shown by the arrows—as noted previously, the direction of gas flow may be reversed to go from top to bottom if needed to improve deposition uniformity on the substrates. FIG. 14D shows the contact points at either end of the substrate clamp which contact the corners of a substrate; the long edge runs very close (for example, about 0.5 mm) to the substrate but does not actually make contact. The triangular cross-section of the clamp along with the rounded shape of the long edge and close proximity to the substrate all assist in providing uniform deposition up to the edge of the substrate and minimize build-up of deposited material at the very edges of the substrate (consequently minimizing the incidence of deposited material bridging the gap between substrate and holder during deposition). FIG. 14C in combination with FIG. 14D show the substrates captured at the corners by the clamps and also show the non-touching of the long edge and the edges of the substrate. The substrate holder attaches to the runways by tongue and groove alignment which allows for thermal expansion as well as providing a tight tolerance. By this alignment the slots (channels) machined into the runway are aligned with gas flow channels between the substrates.

The substrate carriers configured according to the present invention may be loaded using robotic wafer handling equipment. The carrier is provided with lower substrate clamps in place. A robot brings all the substrates for loading on an end effector assembly over the carrier and the substrates are moved laterally until they are aligned to be directly over corresponding bottom clamps. The substrates are then lowered into the bottom clamp, without any contact with the vertical grooves in the inner walls of the substrate carrier, until the substrate corners make contact with the contact points on the substrate clamps. While the substrates are still held on the end effector assembly, the top clamps are lowered along the sidewall groove of the substrate carrier until they make contact with the top corners of the substrate. This method can be performed one substrate at a time as well. The substrate carrier is then mated to the upper and lower runways, using a tongue and groove racetrack arrangement that allows mating of two parts without constraining the thermal expansion of each of the parts. The combined runways and substrate carrier is then loaded into the CVD reactor and the gas manifolds are mated with the runways, for example as described in U.S. Pat. Appl. Publ. No. 2013/0032084. Epitaxial CVD deposition of silicon on single crystal silicon substrates may proceed according to the methods described in U.S. Pat. Appl. Publ. Nos. 2010/0215872, 2010/0263587 and 2013/0032084. Furthermore, as described above, when only one side of the substrate is desired to have silicon deposited on it, the substrates may be loaded in pairs placed back-to-back.

FIGS. 15A-15E are different views of a single-sided deposition substrate holder, according to some embodiments of the present invention. This substrate holder may be used with embodiments such as those shown by FIGS. 4A & 4B, and may be used as an alternative to the configuration for holding wafers shown in FIGS. 8A-8C. FIG. 5A shows two substrates 1503 mounted on a stack of resistive heating elements 1504 between lower clamps 1506 with corner contact regions 1507 and upper clamps 1502 with corner contact regions 1508. Notches 1505 at either end of clamps 1502 are used for moving the clamps in and out of position, as described below. A cap 1501 keeps the upper clamps in place, provides resistive heating, stops gas flow between adjacent channels, and may be electrically tied together with the top resistive heating element so as to reduce the occurrence of arcing or shorting. Gas flow direction 1509 during CVD is parallel to the substrate surfaces, parallel to the vertical edges of the substrates. (The gas flow may also in embodiments be reversed in direction.) Note that the lower clamps are fixed and are made of electrically resistive material—the same as the resistive heating elements—and may also be used as heating elements. The corner contact regions at either end of the clamps make contact with the substrate corners and a majority of the horizontal edges of the substrates are very close to the long edge of the clamps but do not actually make contact. The triangular cross-section of the clamp and close proximity to the substrate all assist in providing uniform deposition up to the edge of the substrate and minimize build-up of deposited material at the very edges of the substrate (consequently minimizing the incidence of deposited material bridging the gap between substrate and holder during deposition).

Figure 15A:
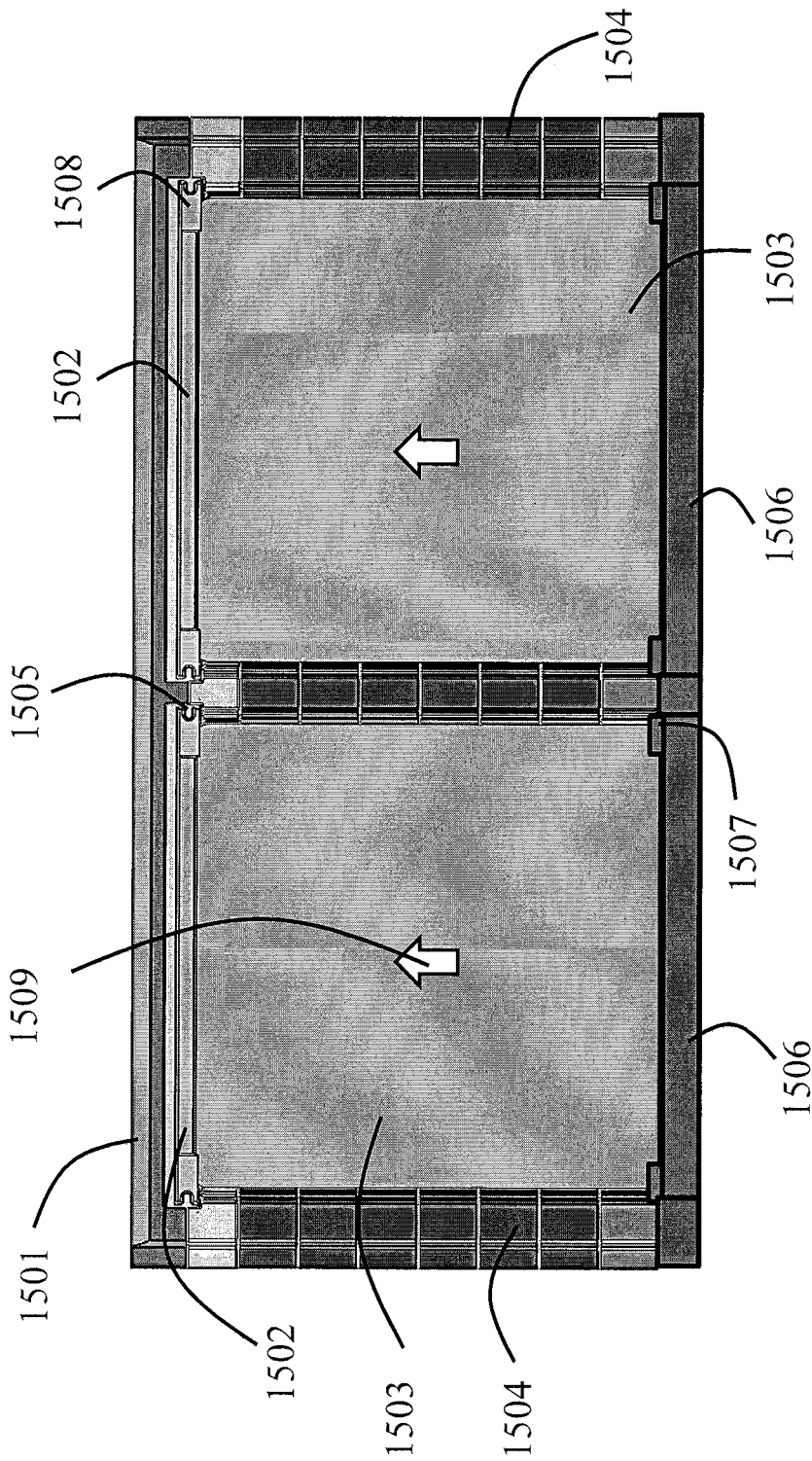
FIGS. 15A-15E are different views of a single-sided deposition substrate holder, according to some embodiments of the present invention.
Figure 15B:
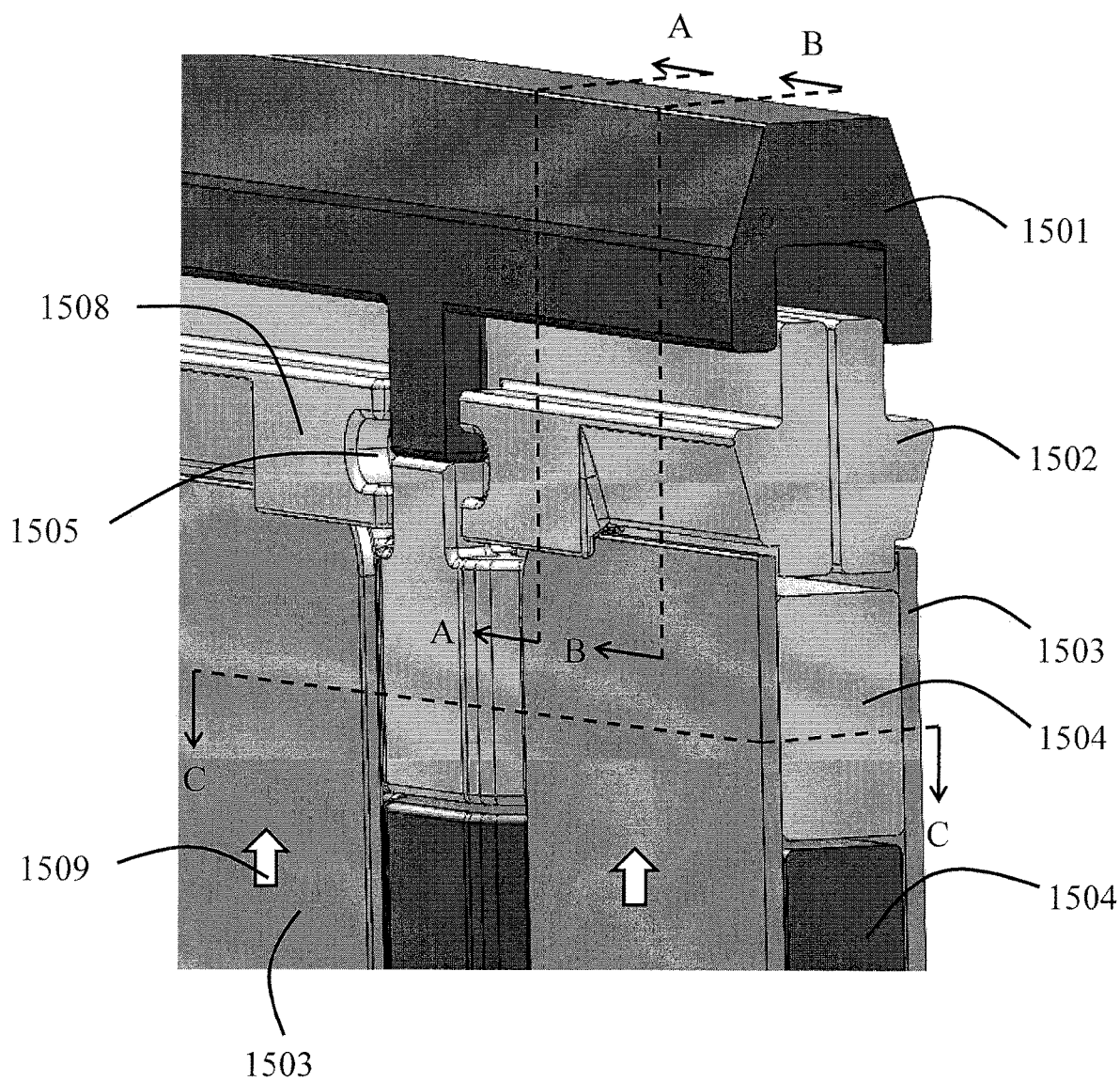
Figure 15C:
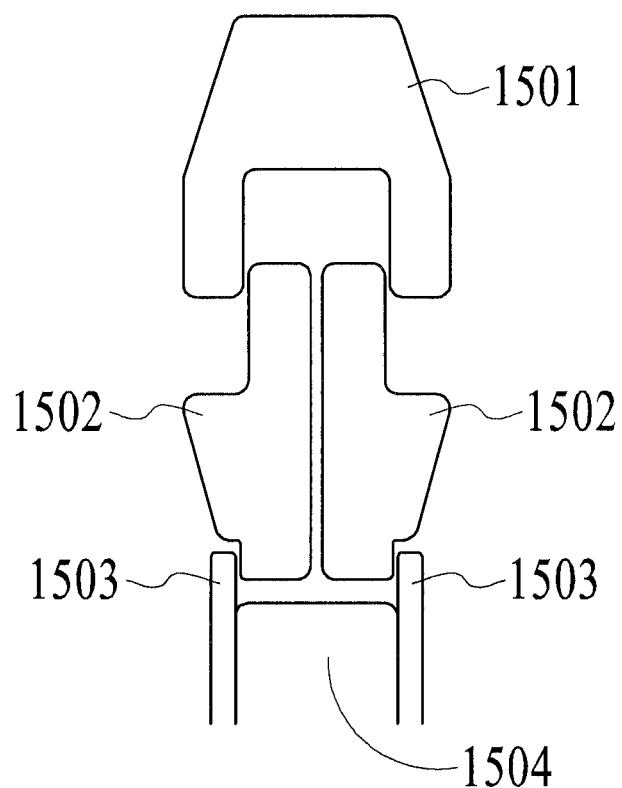
Figure 15D:
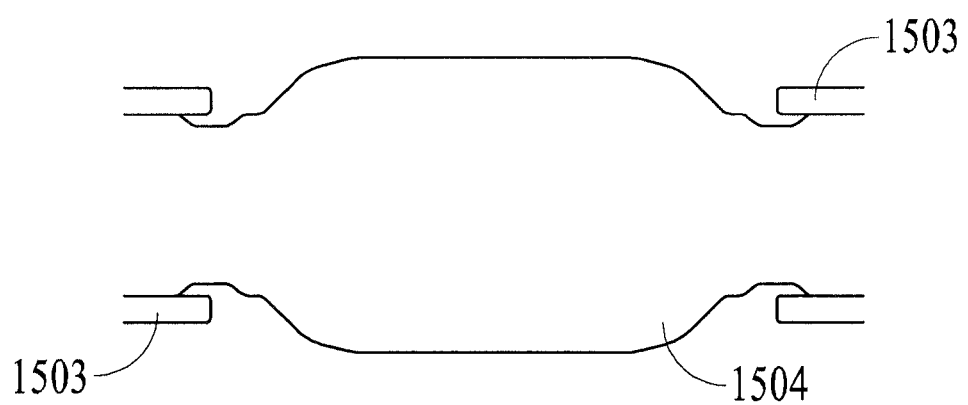
Figure 15E:
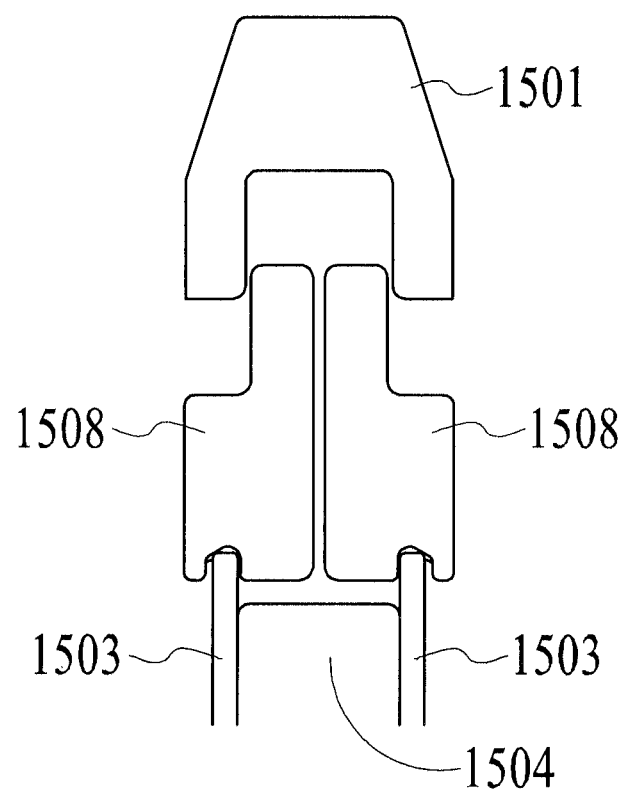

FIG. 15B provides a detailed view of a part of FIG. 15A, showing the two-part configuration of the upper clamps 1502 and the way in which the cap secures the clamps in position. FIGS. 15C, 15D and 15E show cross-sections illustrating further details of the structure. In FIG. 15C the gaps between clamps 1502 and substrates 1503 can readily be seen. There is roughly a half millimeter gap between the top edges of the substrates 1503 and the clamps in the vertical direction, and a clearance between the back surface of the substrates and the clamps of roughly 0.1 to 0.2 millimeters. These clearances have been shown to reduce the occurrence of material bridging between the substrates and the clamps during deposition. FIG. 15D shows an undercut of the substrate edges in the resistive heater elements 1504. The undercut is roughly 0.5 mm to 1 mm, with a depth of roughly the same amount. These clearances have been shown to reduce the occurrence of material bridging between the substrates and the resistive heating elements during deposition. FIG. 15E shows the substrates 1503 being held at the substrate corners by corner contact regions 1508 of the upper clamps. The clearance between the substrates and the clamp around the contact points is roughly 0.1 to 0.2 millimeters, and the clamps overhang the front surfaces of the substrates by roughly 1.5 to 2 millimeters. These overhangs and clearances have been shown to reduce the occurrence of material bridging between the substrates and the corner contact regions of the clamps during deposition. Note that the configuration of the lower clamps with respect to the substrates is the same as for the upper clamps.

Substrates may be loaded into the substrate carrier of FIGS. 15A-15E by placing the bottom corners in place on the corner contact regions of the lower clamps, followed by placing the upper clamps in place—the corner contact regions securing the upper corners of the substrates. The cap is then placed over the upper clamps securing the upper clamps in place.

Although the present invention has been described generally with respect to tools and methods for the CVD deposition of material on substrates, including CVD deposition of thin and thick films of inorganic material for semiconductor devices, including epitaxial single crystal silicon for solar cell devices, the present invention has wide applications. For example, embodiments of the present invention may be used for the fabrication of monocrystalline and multicrystalline silicon solar cells. The principles and concepts of the present invention are applicable to the fabrication of crystalline silicon wafers for a wide variety of uses, including semiconductor devices not requiring high resolution lithography, certain MEMS (micro electro-mechanical systems) devices such as microfluidic devices, etc. Furthermore, embodiments of the present invention may be used for deposition of silicon carbide layers for light emitting diode (LED) fabrication.

Although the present invention has been described with respect to tools and methods for the fabrication of monocrystalline and multicrystalline silicon solar cells, the principles and concepts of the present invention are applicable to epitaxial deposition of a wide range of crystalline materials, including GaAs, GaN, Ge, Si—Ge, InGaAs, SiC (including epitaxially deposited doped 4H-SiC), etc. Deposition of such a wide range of materials is made possible by a porous silicon separation layer on the surface of silicon substrates, which accommodates a greater lattice mismatch than an unmodified crystalline silicon surface. See for example U.S. Pat. No. 9,255,346, incorporated by reference in its entirety herein. Alternatively, other substrates may be used, such as germanium, on which it is expected a suitable porous separation layer can be formed using anodization—the separation layer must allow deposition of an epitaxial film.

Although embodiments of the present disclosure have been particularly described with reference to deposition of epitaxial silicon on single crystal silicon substrates Although embodiments of the present disclosure have been particularly described with reference to certain embodiments thereof, it should be readily apparent to those of ordinary skill in the art that changes and modifications in the form and details may be made without departing from the spirit and scope of the disclosure.

What is claimed is:

1. A substrate carrier for a chemical vapor deposition (CVD) reactor that operates using a process gas and emits an exhaust gas comprising:

a gas tight rectangular box including upper and lower surfaces, said upper and lower surfaces being configured to attach to an upper gas manifold and a lower gas manifold, respectively, said gas tight box comprising a first multiplicity of planar walls across the width of said box, said walls being equally spaced in a row facing each other and defining a row of adjacent channels within said box, said adjacent channels including a plurality of odd numbered channels and a plurality of even numbered channels and extending from said upper surface to said lower surface, said walls comprising mounting fixtures for a plurality of substrates, said walls comprising a second multiplicity of electrically resistive heater elements;

wherein each of said second multiplicity of electrically resistive heater elements are is arranged in parallel stripes roughly perpendicular to a direction through said channels from said upper surface to said lower surface of said gas tight rectangular box;

wherein said first multiplicity of planar walls are parallel;

wherein said upper gas manifold and said lower gas manifold connect with upper and lower ends of said channels, said upper gas manifold and said lower gas manifold being configured to isolate gas flows in the plurality of odd numbered channels from gas flows in the plurality of even numbered channels, utilizing a plurality of gas in apertures, such that the gas flow in the plurality of odd numbered channels simultaneously flow counter to the gas flow in the plurality of even numbered channels, wherein said adjacent channels are numbered in order along said row, wherein gas flows comprise, for each of said upper gas manifold and said lower gas manifold, the exhaust gas and the process gas, and wherein said upper gas manifold utilizes a first gas in aperture of the first plurality of gas in apertures to provide said process gas to all of said even numbered channels during a first cycle and a second gas in aperture to provide said process gas to all of said odd numbered channels during a second cycle, and a first exhaust aperture or a second exhaust aperture to remove the exhaust gas from channels for which process gas is not being provided by said upper gas manifold, and wherein said lower gas manifold is configured to remove the exhaust gas from channels provided with process gas by said upper gas manifold and to provide said process gas to channels exhausted by said upper gas manifold; and wherein said mounting fixtures comprise triangular lower clamps and triangular upper clamps.

2. The substrate carrier of claim 1, wherein said triangular lower clamps each include two corner contacts and said triangular upper clamps each include two corner contacts, said corner contacts being configured to capture the corners of said plurality of rectangular substrates, there being a gap between said edges of said plurality of rectangular substrates between said corners and said mounting fixtures, said triangular lower clamps and said triangular upper clamps being configured parallel to said second multiplicity of heater elements.

3. The substrate carrier of claim 2, wherein said lower clamps are electrically resistive heating elements.

4. The substrate carrier of claim 2, wherein said lower clamps are fixed, and said upper clamps are removable.

5. The substrate carrier of claim 4, further comprising caps for locking said upper clamps in place in said substrate carrier.

6. The substrate carrier of claim 1, wherein each of said second multiplicity of electrically resistive heater elements has a serpentine configuration.

7. The substrate carrier of claim 1, further comprising runways at the top and bottom of said channels.

8. The substrate carrier of claim 1, wherein each of said second multiplicity of electrically resistive heater elements is configured to be independently controllable.

9. The substrate carrier of claim 1, wherein said electrically resistive heater elements comprise silicon carbide coated graphite elements.

10. The substrate carrier of claim 1, wherein said plurality of substrates are a plurality of single crystal silicon substrates.

11. The substrate carrier of claim 1, wherein said plurality of substrates is a plurality of rectangular substrates.

12. The substrate carrier of claim 1, wherein said mounting fixtures comprise insulating plates between said second multiplicity of electrically resistive heater elements and said substrates.

13. The substrate carrier of claim 1, wherein said second multiplicity of electrically resistive heater elements are separated by insulating layers.

14. The substrate carrier of claim 1, wherein said second multiplicity of electrically resistive heater elements are separated by insulating rods.

15. The substrate carrier of claim 1, further comprising substrate holders configured to fit within said channels, said substrate holders being configured to allow gas flow over both surfaces of said substrates when mounted in said substrate holder.

16. A chemical vapor deposition (CVD) reactor for deposition of material on substrates that operates using a process gas and emits an exhaust gas, comprising:

a vacuum chamber;

a substrate carrier within said vacuum chamber comprising a gas tight rectangular box including upper and lower surfaces, said upper and lower surfaces being configured to attach to an upper gas manifold and a lower gas manifold, respectively, said gas tight box comprising a first multiplicity of planar walls across the width of said box, said walls being equally spaced in a row facing each other and defining a row of channels within said box, said adjacent channels including a plurality of odd numbered channels and a plurality of even numbered channels and extending from said upper surface to said lower surface, said walls comprising mounting fixtures for a plurality of substrates, said walls comprising a second multiplicity of electrically resistive heater elements;

wherein each of said second multiplicity of electrically resistive heater elements is arranged in parallel stripes roughly perpendicular to a direction through said channels from said upper surface to said lower surface of said gas tight rectangular box;

wherein said first multiplicity of planar walls are parallel; and wherein said upper gas manifold and said lower gas manifold connect with upper and lower ends of said channels, said upper gas manifold and said lower gas manifold being configured to isolate gas flows in the plurality of odd numbered channels from gas flows in the plurality of even numbered channels, utilizing a plurality of gas in apertures, such that the gas flow in the plurality of odd numbered channels simultaneously flow counter to the gas flow in the plurality of even numbered channels, wherein said adjacent channels are numbered in order along said row, wherein gas flows comprise, for each of said upper gas manifold and said lower gas manifold, the exhaust gas and the process gas, and wherein said upper gas manifold utilizes a first gas in aperture of the first plurality of gas in apertures is configured to provide said process gas to either all of said even numbered channels during a first cycle or and a second gas in aperture to provide said process gas to all of said odd numbered channels during a second cycle, and a first exhaust aperture or a second exhaust aperture to remove the exhaust gas from channels for which process gas is not being provided by said upper gas manifold, and wherein said lower gas manifold is configured to remove the exhaust gas from channels provided with process gas by said upper gas manifold and to provide said process gas to channels exhausted by said upper gas manifold; and wherein said mounting fixtures comprise triangular lower clamps and triangular upper clamps.

17. The CVD reactor of claim 16, wherein said material is silicon.

* * * * *